(12) United States Patent
Zhang

(10) Patent No.: US 11,776,942 B2
(45) Date of Patent: Oct. 3, 2023

(54) METHOD FOR MANUFACTURING DISPLAY PANEL, DISPLAY PANEL, AND DISPLAY APPARATUS

(71) Applicant: Shanghai Tianma Micro-Electronics Co., Ltd., Shanghai (CN)

(72) Inventor: Canyuan Zhang, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 18/067,910

(22) Filed: Dec. 19, 2022

(65) Prior Publication Data
US 2023/0117132 A1    Apr. 20, 2023

(30) Foreign Application Priority Data
Oct. 26, 2022   (CN) .......................... 202211319420.7

(51) Int. Cl.
*H01L 25/16* (2023.01)
*H01L 23/00* (2006.01)

(52) U.S. Cl.
CPC ............ *H01L 25/167* (2013.01); *H01L 24/13* (2013.01); *H01L 24/16* (2013.01); *H01L 24/29* (2013.01);
(Continued)

(58) Field of Classification Search
CPC ....... H01L 25/167; H01L 24/13; H01L 24/16; H01L 24/29; H01L 24/32; H01L 24/73; H01L 24/81; H01L 24/83; H01L 24/92; H01L 24/95; H01L 24/14; H01L 24/30; H01L 2224/13013; H01L 2224/13021; H01L 2224/13109; H01L 2224/13144;
(Continued)

(56) References Cited

U.S. PATENT DOCUMENTS 8,860,045 B2 * 10/2014 Lin ..................... H01L 25/0753
257/E33.057
8,907,364 B2 * 12/2014 Bierhuizen ............. H01L 33/52
257/98
(Continued)

FOREIGN PATENT DOCUMENTS

CN          112750741 A       5/2021

*Primary Examiner* — Vu A Vu
(74) *Attorney, Agent, or Firm* — CHRISTENSEN O'CONNOR JOHNSON KINDNESS PLLC

(57) ABSTRACT

A method for manufacturing a display panel includes providing a backplate, forming bonding parts on backplate, forming an auxiliary layer on backplate, releasing light-emitting elements onto the auxiliary layer such that electrodes of the light-emitting elements are in contact with the first parts to form an intermediate backplate, arranging the intermediate backplate under first predetermined condition under which a fluidity of the first part is greater than that of the second part, and bonding the electrodes and the bonding parts to form an eutectic bonding layer, and arranging the intermediate backplate under second predetermined condition such that the first and second parts form solid-state first and second members. The backplate includes first and second regions. The bonding parts are located in the first regions. The auxiliary layer covers the backplate and the bonding parts. The auxiliary layer includes first and second parts respectively located in the first and second regions.

19 Claims, 22 Drawing Sheets

(52) U.S. Cl.
CPC .............. *H01L 24/32* (2013.01); *H01L 24/73* (2013.01); *H01L 24/81* (2013.01); *H01L 24/83* (2013.01); *H01L 24/92* (2013.01); *H01L 24/95* (2013.01); *H01L 24/14* (2013.01); *H01L 24/30* (2013.01); *H01L 2224/13013* (2013.01); *H01L 2224/13021* (2013.01); *H01L 2224/13109* (2013.01); *H01L 2224/13144* (2013.01); *H01L 2224/14132* (2013.01); *H01L 2224/16145* (2013.01); *H01L 2224/16506* (2013.01); *H01L 2224/29021* (2013.01); *H01L 2224/30132* (2013.01); *H01L 2224/73104* (2013.01); *H01L 2224/81203* (2013.01); *H01L 2224/81805* (2013.01); *H01L 2224/8322* (2013.01); *H01L 2224/83862* (2013.01); *H01L 2224/92225* (2013.01); *H01L 2224/95136* (2013.01); *H01L 2924/01322* (2013.01); *H01L 2924/12041* (2013.01)

(58) Field of Classification Search
CPC . H01L 2224/14132; H01L 2224/16145; H01L 2224/16506; H01L 2224/29021; H01L 2224/30132; H01L 2224/73104; H01L 2224/81203; H01L 2224/81805; H01L 2224/8322; H01L 2224/83862; H01L 2224/92225; H01L 2224/95136; H01L 2924/01322; H01L 2924/12041

USPC .......................................................... 257/91
See application file for complete search history.

(56) References Cited

U.S. PATENT DOCUMENTS

| | | | |
|---|---|---|---|
| 8,921,221 B2* | 12/2014 | McLeod | B23K 1/20 257/E23.021 |
| 9,666,765 B2* | 5/2017 | Choi | H01L 33/50 |
| 9,673,168 B2* | 6/2017 | Saruyama | H01L 24/14 |
| 10,566,214 B1* | 2/2020 | Goward | C23C 14/14 |
| 10,636,937 B2* | 4/2020 | Liao | H01L 33/0095 |
| 2019/0181122 A1* | 6/2019 | Hsu | H01L 33/62 |
| 2020/0010740 A1* | 1/2020 | Lee | C09J 9/02 |
| 2020/0163223 A1* | 5/2020 | Mok | H01L 23/13 |

* cited by examiner

METHOD FOR MANUFACTURING DISPLAY PANEL, DISPLAY PANEL, AND DISPLAY APPARATUS

CROSS-REFERENCE TO RELATED APPLICATIONS

The present application claims priority to Chinese Patent Application No. 202211319420.7, filed on Oct. 26, 2022, the content of which is incorporated herein by reference in its entirety.

TECHNICAL FIELD

The present disclosure relates to the field of display technologies, and in particular, to a display panel, a method for manufacturing a display panel, and a display apparatus.

BACKGROUND

In the manufacturing process of the display panel, light-emitting elements need to be transferred to a backplate through a mass transfer technology. However, the current transfer accuracy of light-emitting elements is low, which affects the yield of the display panel

SUMMARY

In a first aspect, some embodiments of the present disclosure provide a method for manufacturing a display panel. The method includes providing a backplate, forming a plurality of bonding parts on the backplate, the backplate including a plurality of first regions and a second region surrounding the plurality of first regions, and the plurality of bonding parts being located in the plurality of first regions, forming an auxiliary layer on the backplate, the auxiliary layer covering the backplate and the plurality of bonding parts, and the auxiliary layer including a plurality of first parts located in the plurality of first regions and a second part located in the second region, releasing a plurality of light-emitting elements onto the auxiliary layer in such a manner that electrodes of the plurality of light-emitting elements are in contact with the plurality of first parts to form an intermediate backplate; arranging the intermediate backplate under a first predetermined condition under which a fluidity of the plurality of first parts is greater than a fluidity of the second part; and bonding the electrodes of the plurality of light-emitting elements and the plurality of bonding parts to form an eutectic bonding layer, and arranging the intermediate backplate under a second predetermined condition, such that the plurality of first parts forms a plurality of solid-state first members and the second part forms a solid-state second member.

In a second aspect, some embodiments of the present disclosure provide a display panel. The display panel includes a backplate, a eutectic bonding layer and an auxiliary layer that are located at a side of the backplate, and a plurality of light-emitting element bodies. The auxiliary layer includes a plurality of first members and a second member. At least one first member of the plurality of first members surrounds one part of the eutectic bonding layer, and the second member surrounds the plurality of first members. Each of the plurality of light-emitting element bodies is located at a side of the eutectic bonding layer, and is connected to one part of the eutectic bonding layer.

In a third aspect, some embodiments of the present disclosure provide a display apparatus including a display panel. The display panel includes a backplate, a eutectic bonding layer and an auxiliary layer that are located at a side of the backplate, and a plurality of light-emitting element bodies. The auxiliary layer includes a plurality of first members and a second member. At least one first member of the plurality of first members surrounds one part of the eutectic bonding layer, and the second member surrounds the plurality of first members. Each of the plurality of light-emitting element bodies is located at a side of the eutectic bonding layer, and is connected to one part of the eutectic bonding layer.

BRIEF DESCRIPTION OF DRAWINGS

In order to more clearly illustrate the embodiments of the present disclosure, the accompanying drawings used in the embodiments are briefly described below. The drawings described below are merely a part of the embodiments of the present disclosure. The accompanying drawings in the following description are some embodiments of the present disclosure, and other accompanying drawings can be obtained in accordance with these drawings for those skilled in the art.

DESCRIPTION OF EMBODIMENTS

For facilitating the understanding of the technical solution of the present disclosure, the embodiments of the present disclosure are described in detail as below.

It should be understood that the embodiments described below are merely some of, rather than all of the embodiments of the present disclosure. On a basis of the embodiments in this disclosure, all other embodiments obtained by the ordinary skilled in the art without paying creative effort are within a protection scope of this disclosure.

The terms used in the embodiments of the present disclosure are merely for the purpose of describing specific embodiments, but not intended to limit the present disclosure. The singular forms of "a", "an" and "the" used in the embodiments of the present disclosure and the appended claims are also intended to indicate plural forms, unless clearly indicating others.

It should be understood that the term "and/or" used herein merely indicates a relationship describing associated objects, indicating three possible relationships. For example, the expression "A and/or B" indicates: A alone, both A and B, or B alone. The character "/" in this description generally means that the associated objects are in an "or" relationship.

Figure 1:
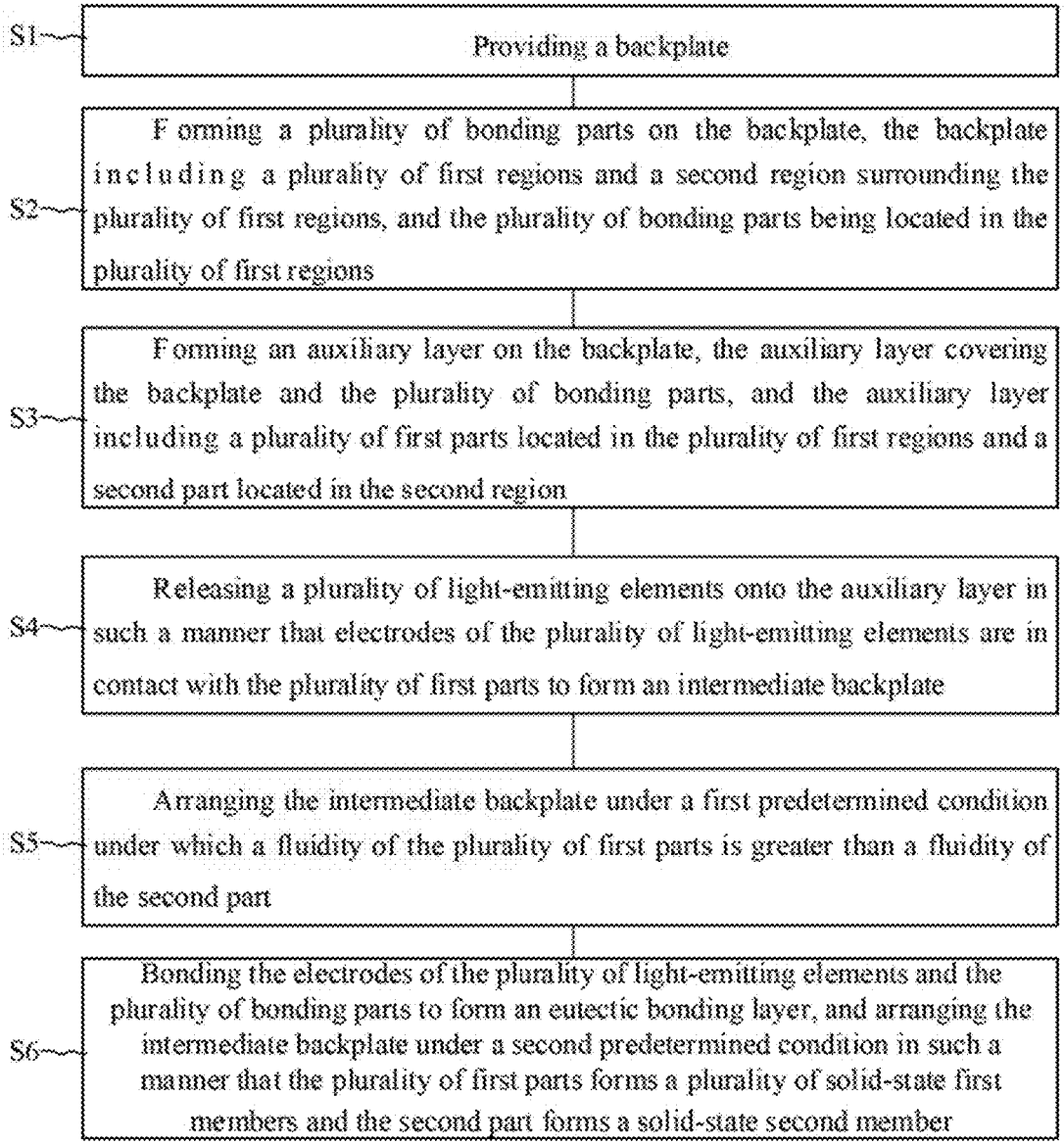
FIG. 1 is a flowchart of a method for manufacturing a display panel provided by some embodiments of the present disclosure.
Figure 2:
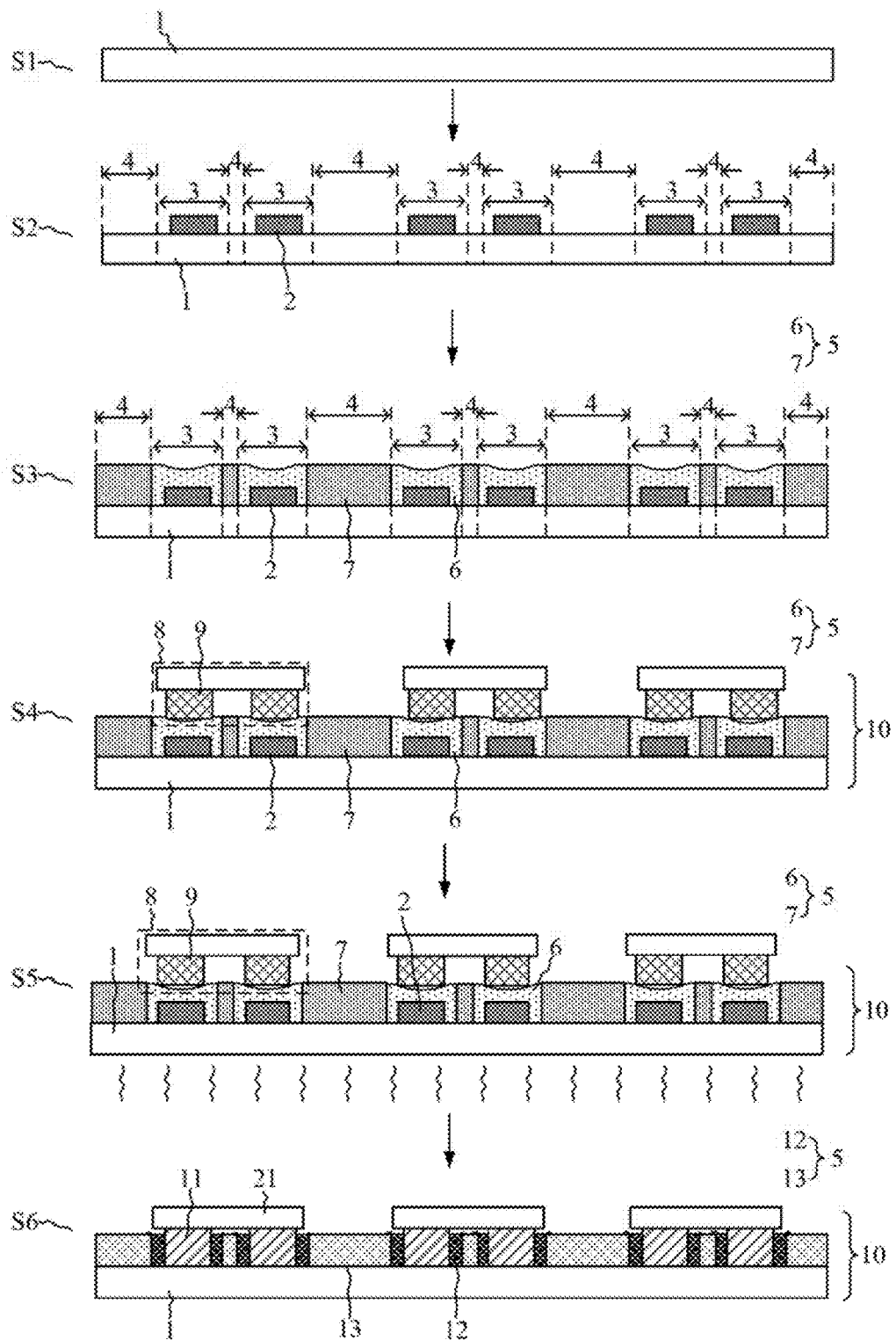
FIG. 2 is a flow diagram showing structures formed in various stages according to a method for manufacturing a display panel provided by some embodiments of the present disclosure.
Figure 3:
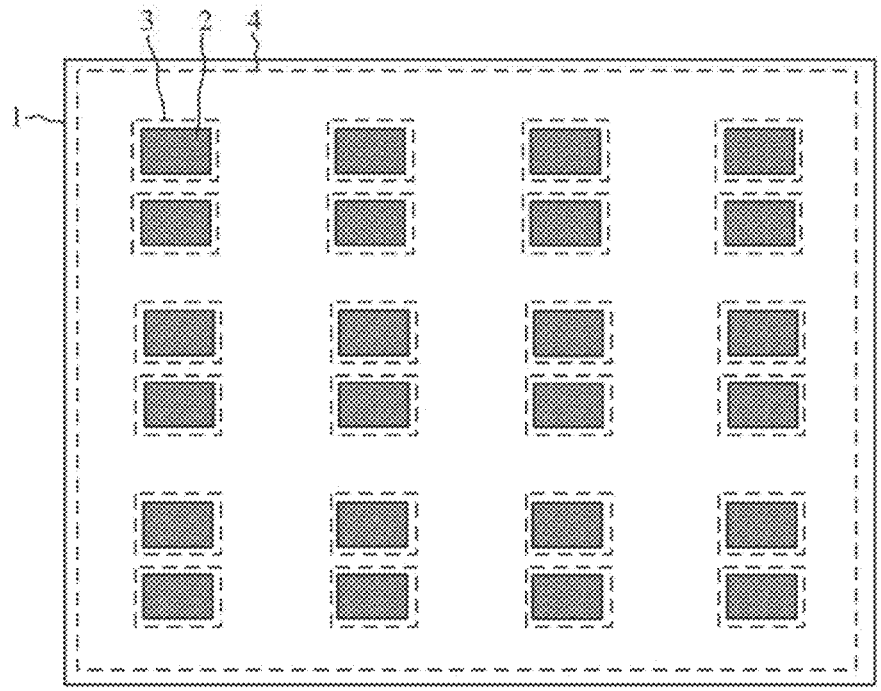
FIG. 3 is a top view of a backplate provided by some embodiments of the present disclosure.
Figure 4:
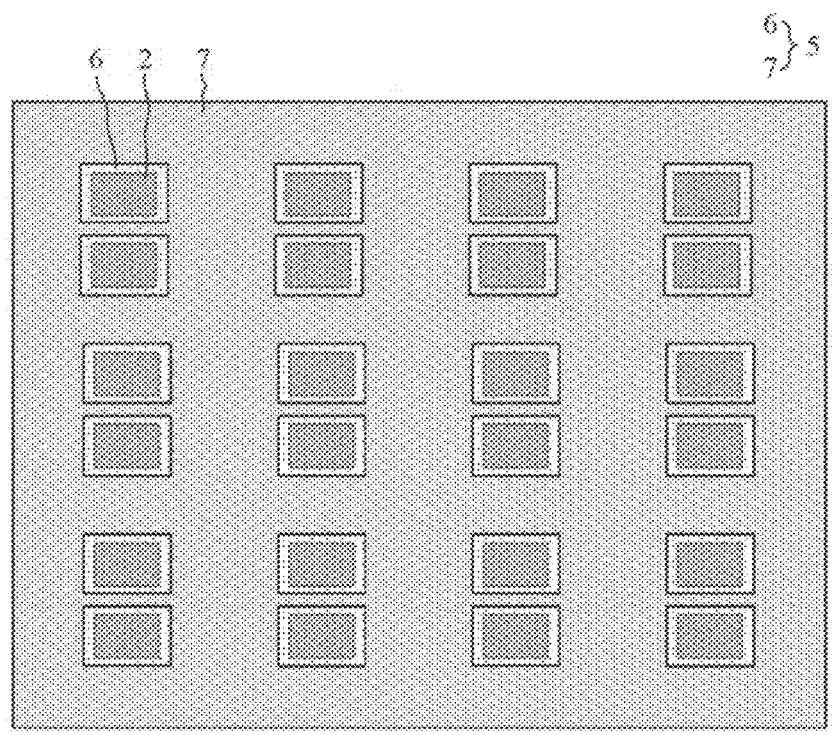
FIG. 4 is a top view of an auxiliary layer before being arranged under a first predetermined condition provided by some embodiments of the present disclosure.

Embodiments of the present disclosure provides a method for manufacturing a display panel. FIG. 1 is a flowchart of a method for manufacturing a display panel provided by some embodiments of the present disclosure. FIG. 2 is a flow diagram showing structures formed in various stages according to a method for manufacturing a display panel provided by some embodiments of the present disclosure. FIG. 3 is a top view of a backplate 1 provided by some embodiments of the present disclosure. FIG. 4 is a top view of an auxiliary layer 5 before being arranged under a first predetermined condition provided by some embodiments of the present disclosure. As shown in FIG. 1 to FIG. 4, the method for manufacturing the display panel includes the steps S1-S6.

At step S1, a backplate 1 is provided.

At step S2, multiple bonding parts 2 are formed on the backplate 1. The backplate 1 includes multiple first regions 3 and a second region 4 surrounding the first regions 3, and the bonding part 2 is located in the first region 3.

The bonding part 2 is located in the first region 3. That is, the first region 3 covers the boding part 2. For example, the first region 3 covers one bonding part 2, the bonding part 2 includes multiple edges. For any one of the multiple edges of the bonding part 2, an edge of the first region 3 is parallel to and located outside the edge of the bonding part 2 and is spaced apart from the edge of the bonding part 2 with a certain distance. For example, a shape of the bonding part 2 is rectangular, a shape of the first region 3 is also rectangular, and the edge of the first region 3 and the edge of the bonding part 2 covered by the first region 3 are spaced apart from each other with a certain distance.

At step S3, an auxiliary layer 5 is formed on the backplate 1. The auxiliary layer 5 covers the backplate 1 and the bonding parts 2. The auxiliary layer 5 includes first parts 6 located in the first regions 3 and a second part 7 in the second region 4. The first region 3 is defined by the first part 6.

At step S4, multiple light-emitting elements 8 are released on the auxiliary layer so that electrodes 9 of the light-emitting elements 8 are in contact with the first parts 6 to form an intermediate backplate 10.

The light-emitting element 8 may be an inorganic light-emitting diode (LED). For example, the light-emitting element 8 may be a miniature light-emitting diode, for example, a micro LED or a mini LED. The light-emitting elements 8 may be transferred from a source substrate or an intermediate substrate and released to the backplate 1 through the mass transfer technology. During releasing, the light-emitting elements 8 may be released separately one by one, or the light-emitting elements 8 may be released group by group, for example, through stamp transfer. In the stamp transfer, by adjusting a viscosity of a layer in contact with the light-emitting element, multiple light-emitting elements 8 can be simultaneously released. For example, the light-emitting elements 8 include red light-emitting elements, green light-emitting elements, and blue light-emitting elements. Multiple red light-emitting elements 8 are simultaneously released on the backplate 1, then multiple green light-emitting elements 8 are simultaneously released on the backplate 1, and finally, multiple blue light-emitting elements 8 are simultaneously released on the backplate 1.

At step S5, the intermediate backplate 10 is arranged under a first predetermined condition under which a fluidity of the first part is greater than a fluidity of the second part.

At step S6, the electrodes 9 of the light-emitting elements 8 are respectively bonded to the bonding parts 2 to form an eutectic bonding layer 11, and the intermediate backplate 10 is arranged under a second predetermined condition, such that the first part 6 forms a solid-state first member 12, and the second part 7 forms a solid-state second member 13. That is, the final auxiliary layer 5 includes the first member 12 and the second member 13.

In some embodiments, the electrode 9 of the light-emitting element 8 and the bonding part 2 are bonded through a thermocompression bonding technique. During the thermocompression bonding technique, the electrode 9 of the light-emitting element 8 is pressed so as to be in contact with the bonding part 2, such that the electrode 9 and the bonding part 2 are bonded to form a eutectic bonding layer 11. For example, the electrode 9 of the light-emitting element 8 is made of Au, the bonding part 2 is made of In, and the eutectic bonding layer 11 formed by bonding the two may be AuIn compound.

Figure 5:
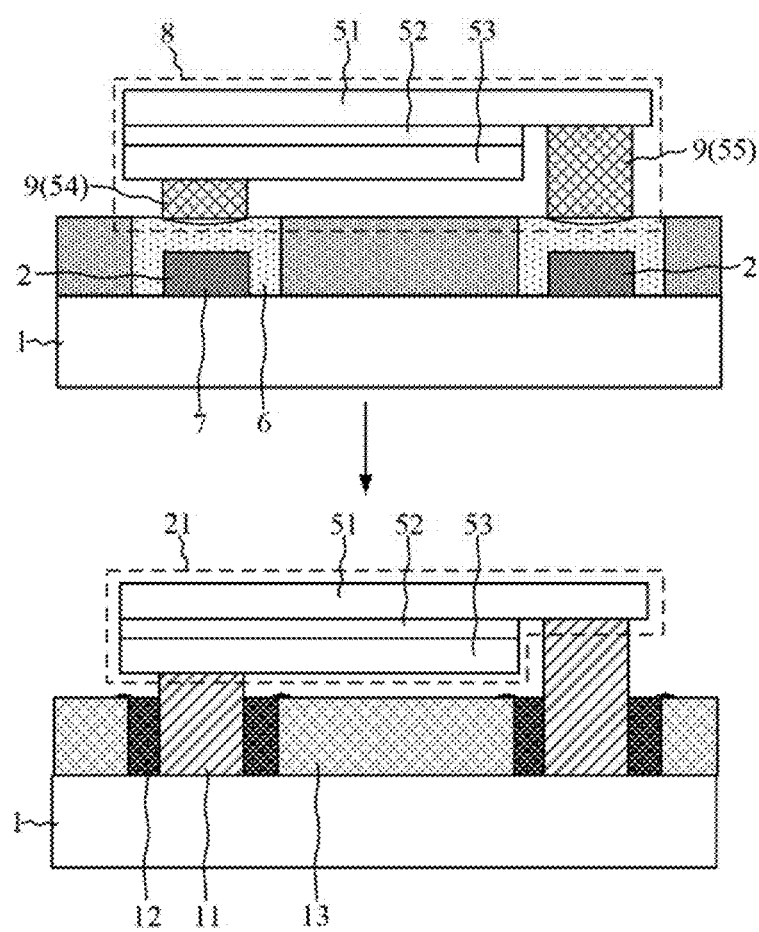
FIG. 5 is a schematic diagram showing layers of a light-emitting element provided by some embodiments of the present disclosure.

FIG. 5 is a schematic diagram showing layers of a light-emitting element provided by some embodiments of the present disclosure. It can be understood that, as shown in FIG. 5, in addition to the electrode 9, the light-emitting element 8 may include an N-type semiconductor 51, a P-type semiconductor 53, and an active layer 52 located between the N-type semiconductor 51 and the P-type semiconductor 53. Electrodes 9 of the light-emitting element 8 include an anode 54 and a cathode 55. The anode 54 is electrically connected to the P-type semiconductor 53. The cathode 55 is electrically connected to the N-type semiconductor 51.

Before the electrode 9 of the light-emitting element 8 and the bonding part 2 are bonded to each other, the electrode 9 and the bonding part 2 are independent from each other. After the electrode 9 and the bonding part 2 are bonded to each other, the electrode 9 and the bonding part 2 form the eutectic bonding layer 11 through bonding. The part other than the electrodes 9 in the light-emitting element 8 may be defined as the light-emitting element body 21. For example, the light-emitting element body 21 may include the N-type semiconductor 51, the P-type semiconductor 53, and the active layer 52.

In the related art, after the light-emitting elements 8 are released from the source substrate or the intermediate substrate to the backplate 1, the electrode 9 of the light-emitting element 8 is directly bonded to the bonding part 2. However, if taking influence such as alignment deviation into account, the actual releasing position of the light-emitting element 8 on the backplate 1 may deviate from its preset releasing area. As a result, the electrode 9 of the light-emitting element 8 is not aligned with its corresponding bonding part 2, thereby affecting a connection reliability when the electrode 9 and the bonding part 2 are bonded.

Figure 6:
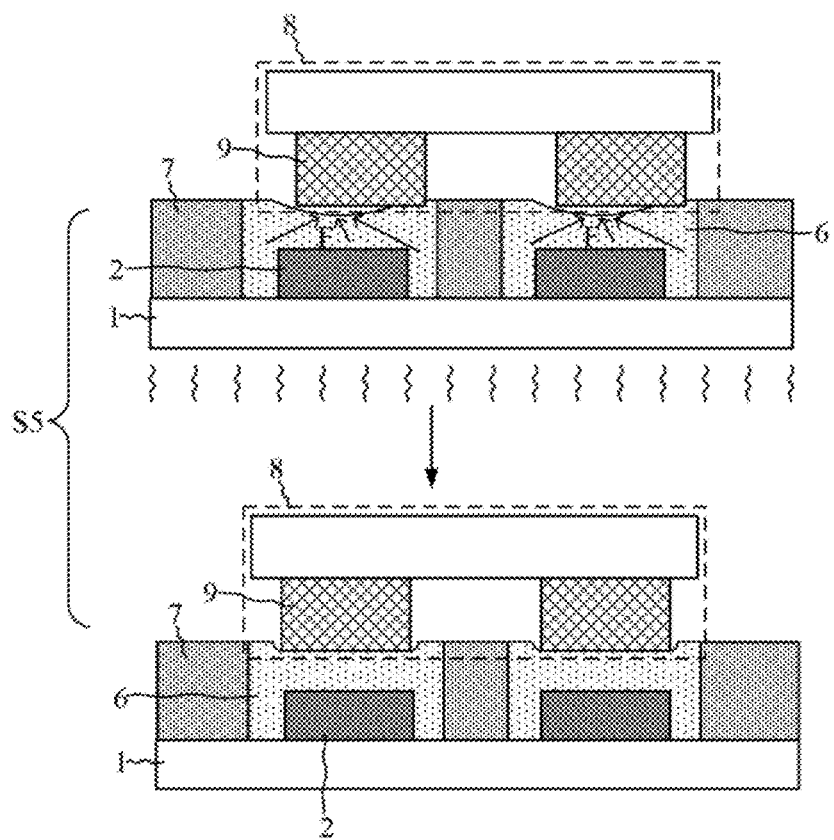
FIG. 6 is a schematic diagram showing the self-alignment of a light-emitting element provided by some embodiments of the present disclosure.

According to the manufacturing method provided by embodiments of the present disclosure, the auxiliary layer 5 is arranged on the backplate 1, and the auxiliary layer 5 is used for adjusting the position of the light-emitting element 8, such that self-alignment of the light-emitting element 8 can be realized. For example, under the first predetermined condition, the fluidity of the first part 6 of the auxiliary layer 5 located in the first region 3 is different from the fluidity of the second part 7 located in the second region 4, such that when the intermediate backplate 10 is arranged under the first predetermined condition, the first part 6 may have a high fluidity, for example, the first member 12 may be in a liquid state. FIG. 6 is a schematic diagram showing the self-alignment of a light-emitting element 8 provided by some embodiments of the present disclosure. As shown in FIG. 6, when the first part 6 flows, the molecules at its surface layer are subjected to a tensile force directed to an interior of a material of the first part 6 under the action of molecules inside the material and under the action of gas molecules, such that the surface of the material has a tendency to shrink, and the surface tension will act on the electrode 9 of the light-emitting element 8 and generate a force F on the electrode 9, which in turn causes a slight translation of the light-emitting element 8, and the light-emitting element 8 is pulled into the preset area, so that the self-alignment of the light-emitting element 8 is realized. Meanwhile, the second part 7 has a low fluidity under the first predetermined condition, for example, the second part 7 may be in a solid state, so the second part 7 can function as a block layer for blocking the flowing of the first part 6 and strengthening the role of the first part 6 on the light-emitting element 8, thereby improving the self-alignment effect of the light-emitting element 8.

Therefore, in embodiments of the present disclosure, the first parts and the second part of the auxiliary layer 5 are designed to have different material characteristics under the first predetermined condition. In the manufacturing process of the display panel, the self-alignment of the light-emitting element 8 can be realized through the surface tension of the first part 6, thereby improving the transfer accuracy of the light-emitting element 8.

In the process of mass transfer, the transfer accuracy of the light-emitting element 8 is typically associated with the transfer efficiency. Due to the influence of temperature on the accuracy of the galvanometer mirror and the stability of the galvanometer mirror when the galvanometer mirror during high-speed scanning, as well as the bottleneck of rapid switching of the position of the carrier of the equipment platform, the transfer accuracy is increased along with the transfer efficiency being reduced. In embodiments of the present disclosure, when the transfer accuracy is increased, the transfer efficiency may be increased in a certain extent.

In embodiments of the present disclosure, the first member 12 refers to a solid-state structure of the material of the first part 6 that is finally presented after the manufacturing process of the display panel is complete, and the second member 13 refers to a solid-state structure of the material of the second part 7 that is finally presented after the manufacturing process of the display panel is complete. It should be understood that the morphology of the originally formed first part 6, the morphology of the first part 6 under the first predetermined condition, and the morphology of the first member 12 may be different; and the morphology of the originally formed second part 7, the morphology of the second part 7 under the first predetermined condition, and the morphology of the second member 13 may also be different.

Figure 7:
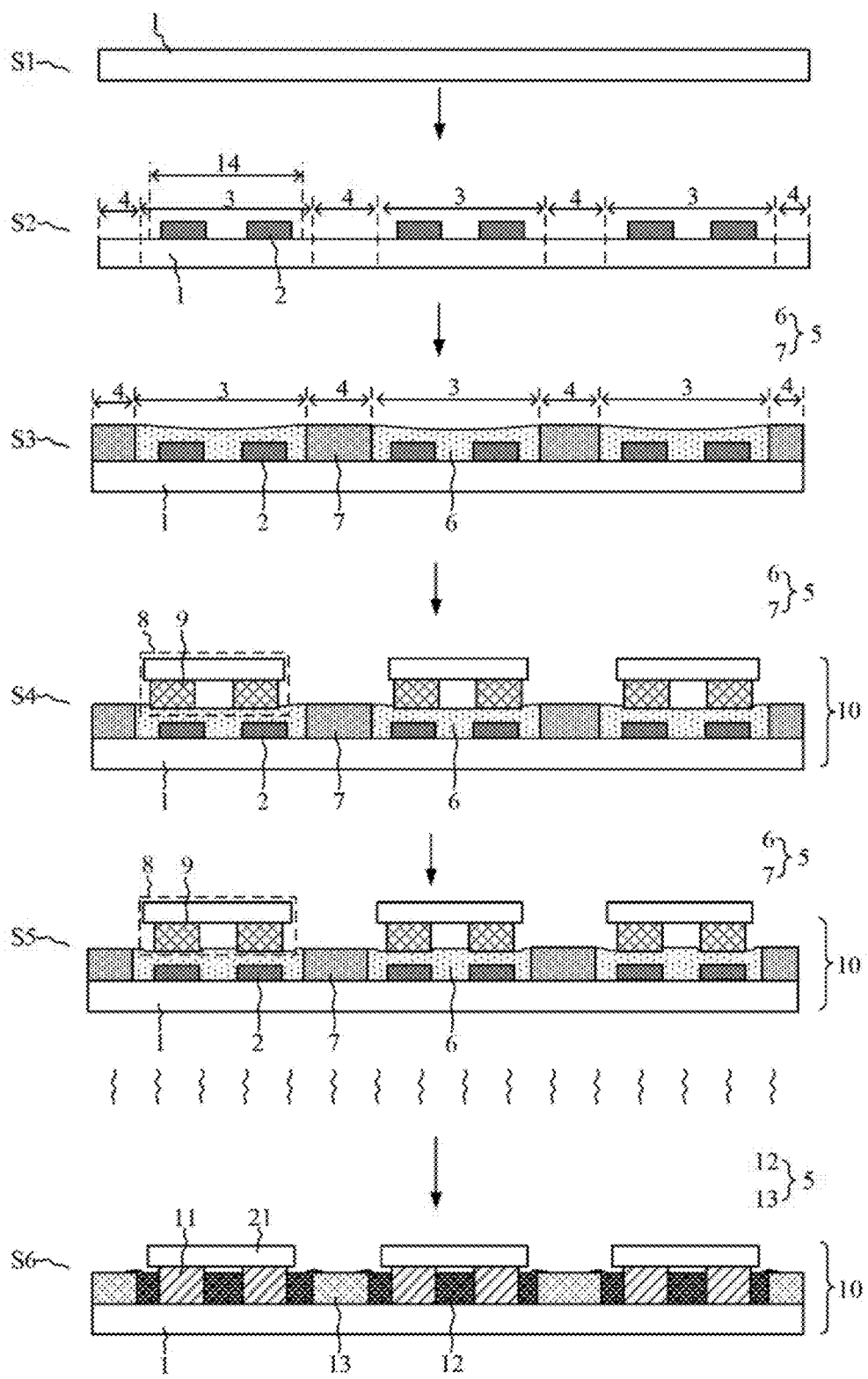
FIG. 7 is another flow diagram showing structures formed in various stages according to another method for manufacturing a display panel provided by some embodiments of the present disclosure.
Figure 8:
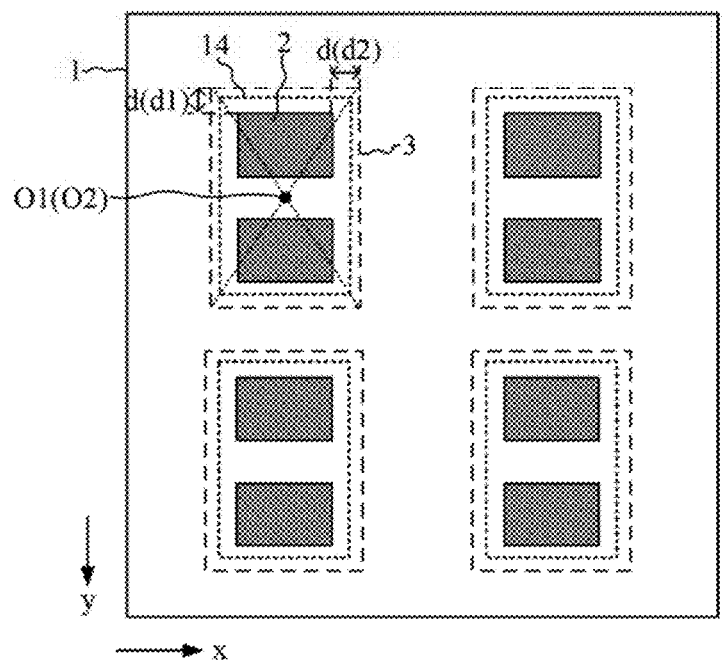
FIG. 8 is a schematic diagram of a first region provided by some embodiments of the present disclosure.

FIG. 7 is another flow diagram showing structures formed in various stages according to another method for manufacturing a display panel provided by some embodiments of the present disclosure. FIG. 8 is a schematic diagram of a first region 3 provided by some embodiments of the present disclosure. In some embodiments, as shown in FIG. 7 and FIG. 8, the backplate 1 includes multiple light-emitting element pre-arranging regions 14. One light-emitting element 8 is provided in the light-emitting element pre-arranging region 14. An area of the light-emitting element pre-arranging region 14 may be equal to an area of the orthographic projection of the light-emitting element 8 on the backplate 1. In some embodiments of the present disclosure, the first regions 3 correspond to the light-emitting element pre-arranging regions 14 in one-to-one correspondence.

The light-emitting element pre-arranging region 14 includes multiple edges. For any one edge of the light-emitting element pre-arranging region 14, an edge of the first region 3 is parallel to and located outside the edge of the light-emitting element pre-arranging region 14 and is spaced apart from the edge of the light-emitting element pre-arranging region 14 with a certain distance. For example, as shown in FIG. 8, a shape of the light-emitting element pre-arranging region 14 is rectangular, the shape of the first region 3 is also rectangular.

In the above configuration, one first region 3 corresponds to one light-emitting element 8, that is, one first part 6 corresponds to one light-emitting element 8. Therefore, when the intermediate backplate 10 is arranged under the first predetermined condition, the flowing of one first part 6 only acts on the electrode 9 of one light-emitting element 8. The surface tension of the first part 6 when the first part 6 is flowing pulls one light-emitting element 8 corresponding to the first part 6 to the light-emitting element pre-arranging region 14, such that the final position of the light-emitting element 8 and the light-emitting element pre-arranging region 14 coincides with each other, thereby improving the transfer accuracy of the light-emitting element 8.

In some embodiment, as shown in FIG. 8, the first region 3 covers its corresponding light-emitting element pre-arranging region 14, and the geometric center O1 of the first region 3 may coincide with the geometric center O2 of its corresponding light-emitting element pre-arranging region 14. In this case, after the auxiliary layer 5 is formed, the geometric center O1 of the first region 3 still coincides with the geometric center O2 of its corresponding light-emitting element pre-arranging region 14. The surface tension of the first part 6 has a substantially uniform effect on the light-emitting element 8 in all directions, so it is conducive to the self-alignment of the light-emitting element 8.

Figure 9:
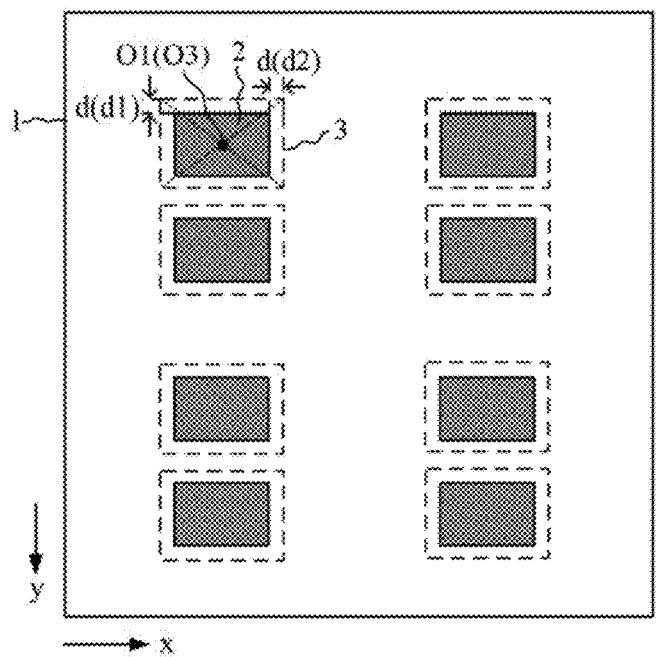
FIG. 9 is another schematic diagram of a first region provided by some embodiments of the present disclosure.

FIG. 9 is another schematic diagram of a first region 3 provided by some embodiments of the present disclosure. In some embodiments, as shown in FIG. 2 and FIG. 9, the first regions 3 correspond to the bonding parts 2 in one-to-one correspondence.

The bonding part 2 includes multiple edges. For any one edge of bonding part 2, an edge of the first region 3 is parallel to and located outside the edge of the bonding part 2 and is spaced apart from the edge of the bonding part 2 with a certain distance. For example, as shown in FIG. 9, the shape of the bonding part 2 is rectangular, and the shape of the first region 3 is also rectangular.

It can be understood that the electrodes 9 of the light-emitting element 8 include an anode and a cathode, one anode corresponds to one bonding part 2, and one cathode corresponds to another bonding part 2. In the above configuration, one first region 3 corresponds to one bonding part 2, and the flowing of one first part 6 only acts on one anode or one cathode of the light-emitting element when the intermediate backplate 10 is arranged under the first predetermined condition. The surface tension of the first part 6 when the first part 6 is flowing pulls the one anode or the one cathode corresponding to the first part 6 to be aligned with the bonding part 2, such that the final position of the light-emitting element 8 and the light-emitting element pre-arranging region 14 coincides with each other.

Based on the above configuration, after the auxiliary layer 5 is formed, two adjacent first bonding parts 2 are spaced apart from each other by the second part 7. When the intermediate backplate 10 is arranged under the first predetermined condition, the second part 7 can limit the movement of the positive and cathodes of the light-emitting element 8, and thus it is avoided that the anode of the light-emitting element 8 moves to the bonding part 2 that is designed to be in contact with the cathode, or the cathode moves to the bonding part 2 that is designed to be in contact with the anode, thereby effectively reducing the short circuit risk of the positive and cathodes of the light-emitting element 8.

In one embodiment, as shown in FIG. 9, the first region 3 covers its corresponding bonding part 2, and a geometric center O1 of the first region 3 may coincide with a geometric center O3 of its corresponding bonding part 2. In this case, after the auxiliary layer 5 is formed, the geometric center O1 of the first region 3 also coincide with the geometric center of the bonding part 2. The surface tension of the first part 6 has a substantially uniform effect on the electrode 9 of the light-emitting element 8 in all directions, so it is more conducive to the self-alignment of the light-emitting element 8.

In some embodiment, as shown in FIG. 8 and FIG. 9, the first region 3 covers the bonding part 2. For example, the first region 3 covers one bonding part 2 or covers two bonding parts 2 in one light-emitting element pre-arranging region 14. A distance d between the edge of the first region 3 and the edge of the bonding part 2 covered by the first region 3 satisfies: 3 µm≤d<30 µm.

As shown in FIG. 8 and FIG. 9, a distance d between the edge of the first region 3 extending in the first direction x and the edge of the bonding part 2 extending in the first direction x is denoted by d1, and a distance d between the edge of the first region 3 extending in the second direction y and the edge of the bonding part 2 extending in the second direction y is denoted by d2, d1 and d2 satisfy 3 µm≤d1<30 µm and 3 µm≤d2<30 µm, and d1 and d2 may be equal or may be different.

Taking into account factors such as process accuracy, the actual arranging position of the bonding part 2 may be slightly offset. By arranging the minimum distance between the edge of the first region 3 and the edge of the bonding part 2 covered by the first region 3 to 3 µm, the bonding part 2 is still located within the first region 3 even if the bonding part 2 is slightly offset, such that the first part 6 can cover the bonding part 2 when the auxiliary layer 5 is formed. By arranging the maximum distance between the edge of the first region 3 and the edge of the bonding part 2 covered by the first region 3 to 30 µm, it is avoided that the area of the first region 3 is too large, and the effect of the flowing of the first part 6 to the light-emitting element 8 is enhanced.

Figure 10:
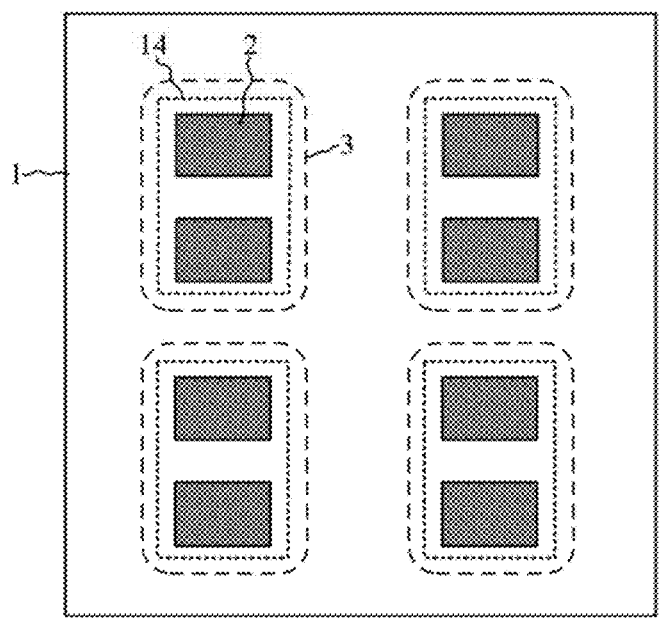
FIG. 10 is yet another schematic diagram of a first region provided by some embodiments of the present disclosure.
Figure 11:
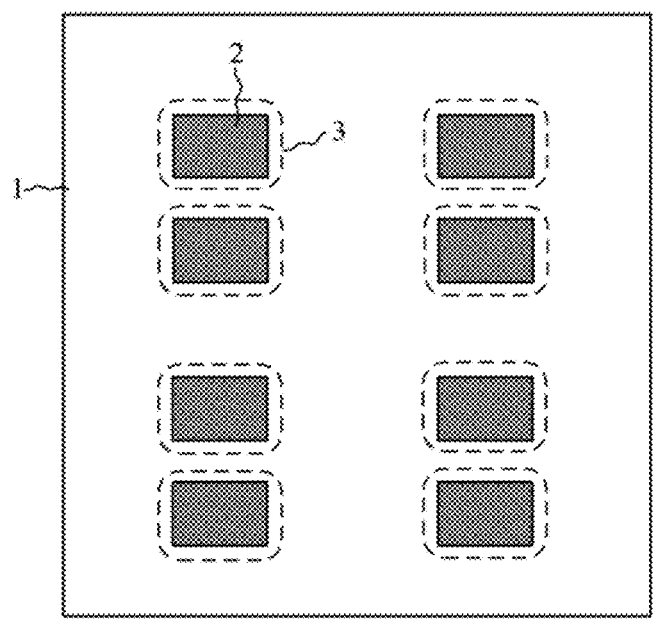
FIG. 11 is yet another schematic diagram of a first region provided by some embodiments of the present disclosure.
Figure 12:
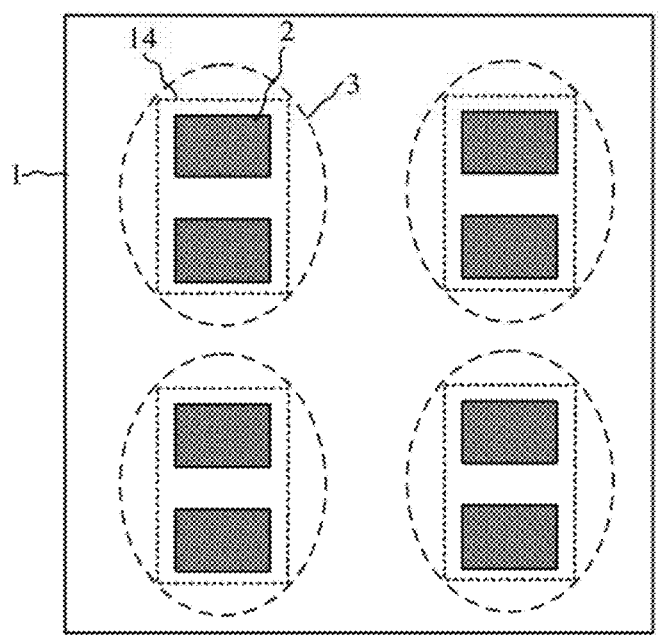
FIG. 12 is yet another schematic diagram of a first region provided by some embodiments of the present disclosure.
Figure 13:
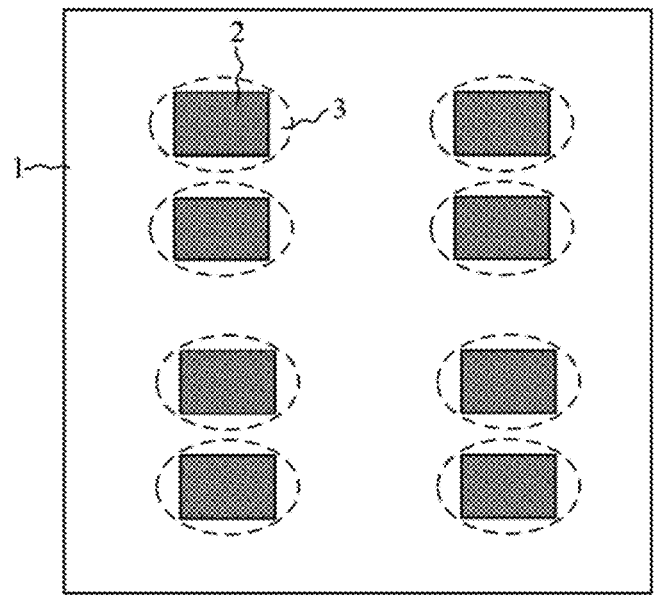
FIG. 13 is yet another schematic diagram of a first region provided by some embodiments of the present disclosure.

In some embodiments, as shown in FIG. 8 and FIG. 9, the shape of the first region 3 may be a rectangle. FIG. 10 is yet another schematic diagram of a first region 3 provided by some embodiments of the present disclosure. FIG. 11 is yet another schematic diagram of a first region 3 provided by some embodiments of the present disclosure. In some embodiments, as shown in FIG. 10 and FIG. 11, the shape of the first region 3 may be a rounded rectangle. FIG. 12 is yet another schematic diagram of a first region 3 provided by some embodiments of the present disclosure. FIG. 13 is yet another schematic diagram of a first region 3 provided by some embodiments of the present disclosure. In some embodiments, as shown in FIG. 12 and FIG. 13, the shape of the first region 3 may be a circle or oval.

In the above configuration, the first region 3 has a regular shape. When the first part 6 flows, the surface tension of the first part 6 has a substantially uniform the degree of effect on the light-emitting element 8 in all directions, so it is more conducive to the self-alignment of the light-emitting element 8.

In some embodiments, when one first region 3 corresponds to one light-emitting element pre-arranging region 14, as shown in FIG. 8, if the first region 3 has a rectangle shape, a long side of the first region 3 is parallel to a long side of the light-emitting element pre-arranging region 14. As shown in FIG. 12, if the first region 3 has an oval shape, a long diameter of the first region 3 is parallel to the long side of the light-emitting element pre-arranging region 14. In this way, it is avoided that the first region 3 occupies a large space in the direction of the short side of the light-emitting element pre-arranging region 14, and the position of the first region 3 is more reasonable.

When one first region 3 corresponds to one bonding part 2, as shown in FIG. 9, if the first region 3 has a rectangle shape, a long side of the first region 3 is parallel to a long side of the bonding part 2. As shown in FIG. 13, if the first region 3 has an oval shape, a long diameter of the first region 3 is parallel to the long side of the bonding part 2. In this way, it is avoided that the first region 3 occupies a large space in the direction of the short side of the bonding part 2, and the position of the first region 3 is more reasonable.

Figure 14:
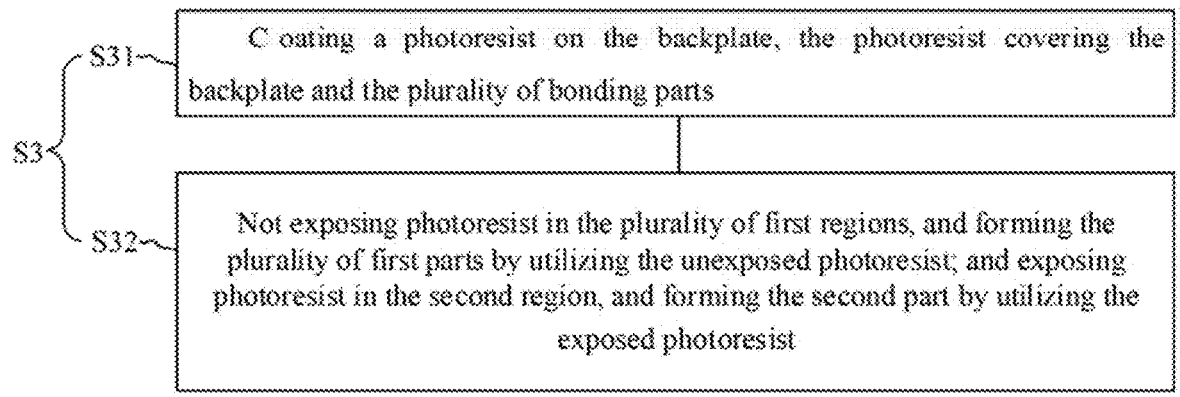
FIG. 14 is another flowchart of a method for manufacturing a display panel provided by some embodiments of the present disclosure.
Figure 15:
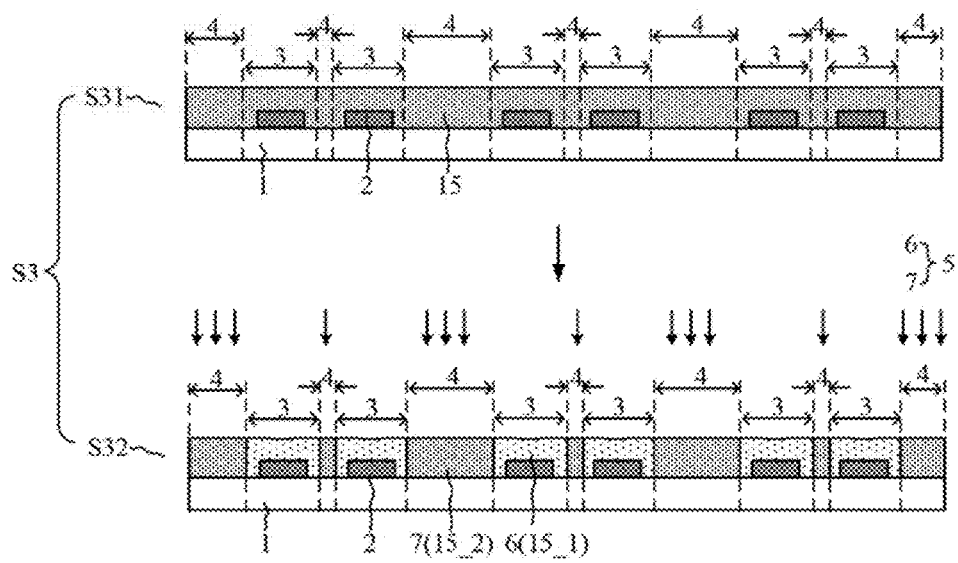
FIG. 15 is another flow diagram showing structures formed in various stages according to another method for manufacturing a display panel provided by some embodiments of the present disclosure.

FIG. 14 is a flowchart of another method for manufacturing a display panel provided by some embodiments of the present disclosure. FIG. 15 is another flow diagram showing structures in various stages of another method for manufacturing a display panel provided by some embodiments of the present disclosure. In some embodiments of the present disclosure, as shown in FIG. 14 and FIG. 15, the step S3 may include steps S31 and S32.

At step S31, a photoresist 15 is formed on the backplate 1 by coating, and the photoresist 15 covers the backplate 1 and the bonding parts 2.

At step S32, the photoresist in the first regions 3 is not exposed, and the first part 6 is formed by the unexposed photoresist (for clarity, the unexposed photoresist is denoted by 15_1 in the drawings); and the photoresist in the second region 4 is exposed, and the second part 7 is formed by the exposed photoresist (for clarity, the exposed photoresist is denoted by 15_2 in the drawings).

The light shown at step S32 in FIG. 15 represents the light that has passed through the mask. During exposing, the mask is placed above the photoresist 15. The light has a same intensity at all positions before passing through the mask. The mask only allows the light corresponding to the second region 4 to pass through, such that only the photoresist 15 in the second region 14 are exposed.

In some embodiments, the process of arranging the intermediate backplate 10 under the first predetermined condition includes: heating the intermediate backplate 10 to a first predetermined temperature range, where in the first predetermined temperature range, the viscosity of the unexposed photoresist 15_1 is smaller than the viscosity of the exposed photoresist 15_2.

The process of arranging the intermediate backplate 10 under the second predetermined condition includes: heating the intermediate backplate 10 to a second predetermined temperature range, where in the second predetermined temperature range, the unexposed photoresist 15_1 is in a solid state and forms the first member 12, and the exposed photoresist 15_2 is in a solid state and forms the second member 13.

In the above configurations, both the first part 6 and the second part 7 are made of the photoresist material. The photoresist has a certain viscosity. The unexposed photoresist does not undergo crosslink reaction and does not harden. Within a certain temperature range, the viscosity of the photoresist decreases as the increasing of the temperature, and thus the fluidity of the photoresist increases. The exposed photoresist hardens due to the crosslink reaction, and remains in the harden state after being heated. The exposed photoresist has a very small fluidity or even does not flow. In this way, the fluidity of the first part 6 and the fluidity of the second part 7 satisfy the design requirements.

In some embodiments, the first part 6 and the second part 7 are made of the same material. When coating, on the backplate 1, the photoresist covering the backplate 1 and the bonding part 2, the upper surface of the entire photoresist layer on the side away from the backplate 1 is planar, such that the fluctuation of the upper surface of the first part 6 and the upper surface of the second part 7 can be reduced. When the light-emitting element 8 is released onto the auxiliary layer 5, the placement stability of the light-emitting element 8 can be improved, avoiding incline of the light-emitting element 8.

It can be understood that, in embodiments of the present disclosure, the electrode 9 of the light-emitting element 8 and the bonding part 2 are bonded through a thermal compression bonding process. Since the thermal compression bonding process needs high temperature, the process of heating the intermediate backplate 10 to the second predetermined temperature range may be performed synchronously with the thermal compression bonding process. That is, the process of bonding the electrode 9 of the light-emitting element 8 and the bonding part 2 can cause the intermediate backplate 10 within the second predetermined temperature range. In this way, the unexposed photoresist is in a solid state and forms the first member 12, and the exposed photoresist is in a solid state and forms the second member 13.

It can be understood that when exposing the photoresist in the second region 4, the light source irradiates this part of the photoresist from top to bottom (in a direction from the auxiliary layer 5 to the backplate 1), so the crosslinking reaction of the photoresist in the second region 4 in the exposing process is from top to bottom. When the intermediate backplate 10 is heated to the second predetermined temperature range, the crosslinking reaction of the photoresist in the first region 3 is from bottom to top (in a direction from the backplate 1 to the auxiliary layer 5). If the photoresist in the first region 3 and the photoresist in the second region 4 are not completely reacted in the crosslinking reaction, the formed first member 12 and second member 13 may be different in composition.

In some embodiments, the first predetermined temperature range has a minimum temperature value of 80° C. and a maximum temperature value of 120° C., and a minimum temperature value of the second predetermined temperature range is 150° C.

The unexposed photoresist has a high fluidity when being heated to 80° C. to 120° C., and its fluidity satisfies the requirement. The unexposed photoresist is cured when being heated to a temperature above 150° C., and forms the first member 12, such that the eutectic bonding layer 11 is fixed to the position.

In some embodiments, when coating the photoresist on the backplate 1, a temperature for coating the second region 4 is smaller than a temperature for coating the first region 3.

Figure 16:
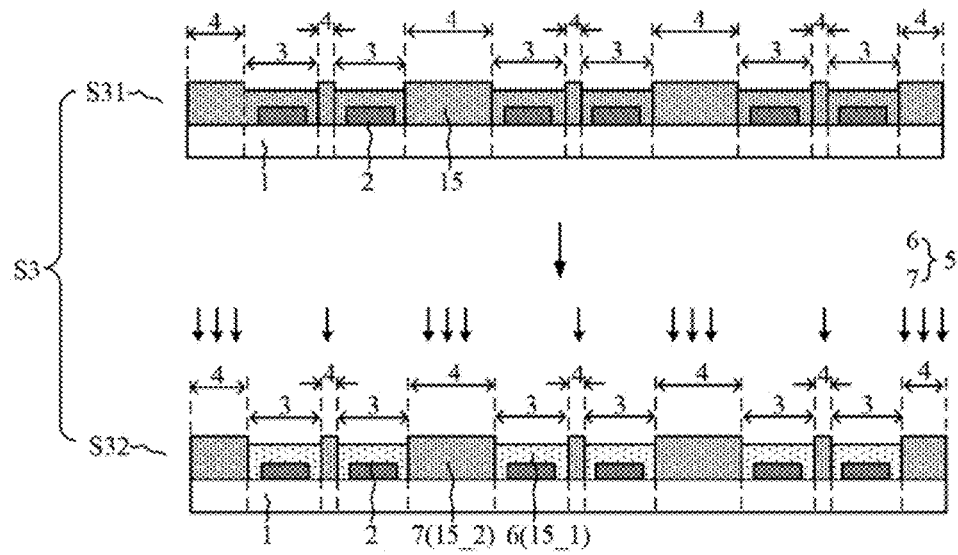
FIG. 16 is another flow diagram showing structures formed in various stages according to another method for manufacturing a display panel provided by some embodiments of the present disclosure.

By controlling the temperature for coating the first region 3 and the temperature for coating the second region 4, the thickness of the photoresist in the first region 3 and the thickness of the photoresist in the second region 4 can be adjusted. FIG. 16 is another flow diagram showing structures in various stages of another method for manufacturing a display panel provided by some embodiments of the present disclosure. In some embodiments, as shown in FIG. 16, the thickness of the photoresist in the second region 4 can be increased by decreasing the temperature of the temperature for coating the second region 4, such that the upper surface of the photoresist (the second part 7) in the second region 4 on the side opposite to the backplate 1 is higher than the upper surface of the photoresist (the first part 6) in the first region 3 on the side opposite to the backplate 1, which can reduce the overflow risk when the photoresist (the first part 6) in the first region 3 flows in the subsequent process step.

Figure 17:
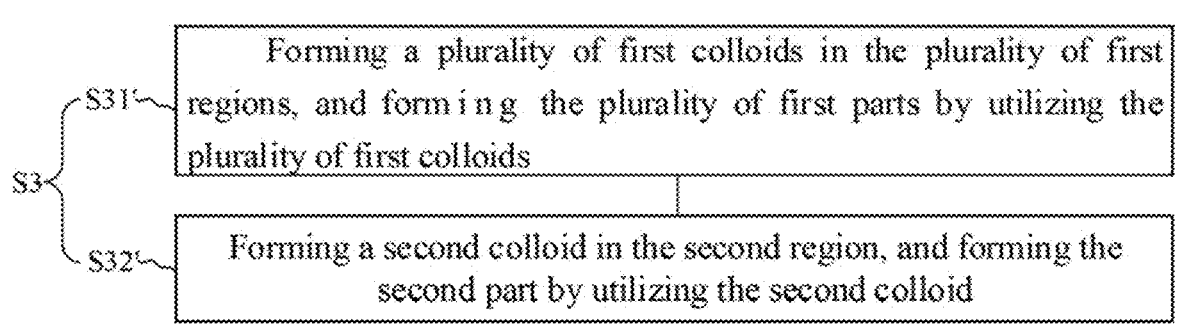
FIG. 17 is yet another flowchart of a method for manufacturing a display panel provided by some embodiments of the present disclosure.
Figure 18:
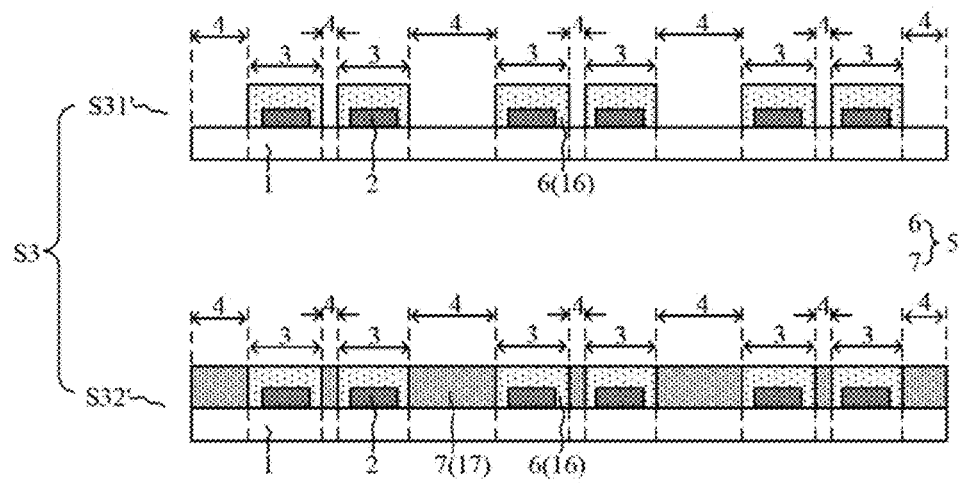
FIG. 18 is another flow diagram showing structures formed in various stages according to a method for manufacturing a display panel provided by some embodiments of the present disclosure.

FIG. 17 is yet another flowchart of a method for manufacturing a display panel provided by some embodiments of the present disclosure. FIG. 18 is another flow diagram showing structures in various stages of the method for manufacturing a display panel provided by some embodiments of the present disclosure. In some embodiments, as shown in FIG. 17 and FIG. 18, the step S3 may include steps S31' and S32'.

At step S31', a first colloid 16 is formed in the first region 3, and the first part 6 is formed through the first colloid 16.

At step S32', a second colloid 17 is formed in the second region 4, and the second part 7 is formed through the second colloid 17.

Based on the above, the process of arranging the intermediate backplate 10 under the first predetermined condition includes: applying an external force to the intermediate backplate 10. When the external force is applied to the intermediate backplate 10, a thixotropy of the first colloid 16 is greater than a thixotropy of the second colloid 17.

The process of arranging the intermediate backplate 10 under the first predetermined condition includes: stopping applying the external force to the intermediate backplate 10, and letting the intermediate backplate 10 to stand. The first colloid 16 is in a solid state and forms the first member 12, and the second colloid 17 is in a solid state and forms the second member 13.

The first colloid 16 may be a high-thixotropy epoxy series colloid, and the second colloid 17 may be a low-thixotropy epoxy series colloid.

The first colloid 16 and the second colloid 17 become sols with certain fluidity under the action of external force. After standing for a period of time, the first colloid 16 and the second colloid 17 gradually return to the original gel state. When the external force is applied, the thixotropy of the first colloid 16 is larger, so the fluidity of the first colloid 16 is higher, and then the flowing of the first colloid 16 can be used to realize the self-alignment of the light-emitting element 8.

Figure 19:
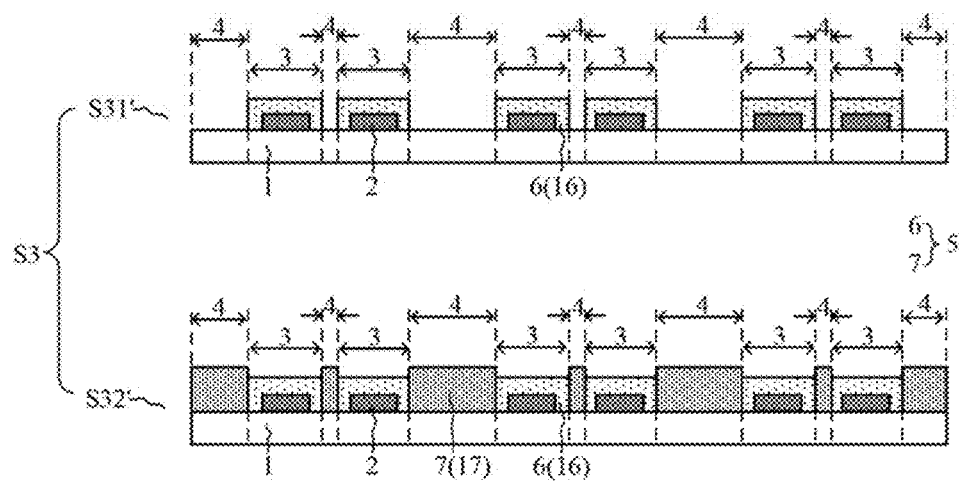
FIG. 19 is another flow diagram showing structures formed in various stages according to a method for manufacturing a display panel provided by some embodiments of the present disclosure.

It can be understood that the first colloid 16 and the second colloid 17 may be formed by different patterning processes, so the upper surface of the first colloid 16 on the side opposite to the backplate 1 and the upper surface of the second colloid 17 on the side opposite to the backplate 1 may not be at the same level. FIG. 19 is another flow diagram showing structures in various stages of the method for manufacturing a display panel provided by some embodiments of the present disclosure. For example, as shown in FIG. 19, the upper surface of the second colloid 17 on the side opposite to the backplate 1 is higher than the upper surface of the first colloid 16 on the side opposite to the backplate 1, such that the overflow risk due to the flowing of the first colloid 16 is reduced when the intermediate backplate 10 is subsequently placed under an external force condition.

It should be noted that when the electrode 9 of the light-emitting element 8 and the bonding part 2 are bonded through the thermal compression bonding process, it does not need to shake the intermediate backplate 10, so the standing process of the intermediate backplate 10 and the thermal compression bonding process may be synchronously performed. That is, the process of bonding the electrode 9 of the light-emitting element 8 and the bonding part 2 enables the intermediate backplate 10 to stand. Accordingly, the first colloid 16 is in the solid state and forms the first member 12, and the second colloid 17 is in the solid state and forms the second member 13.

Figure 20:
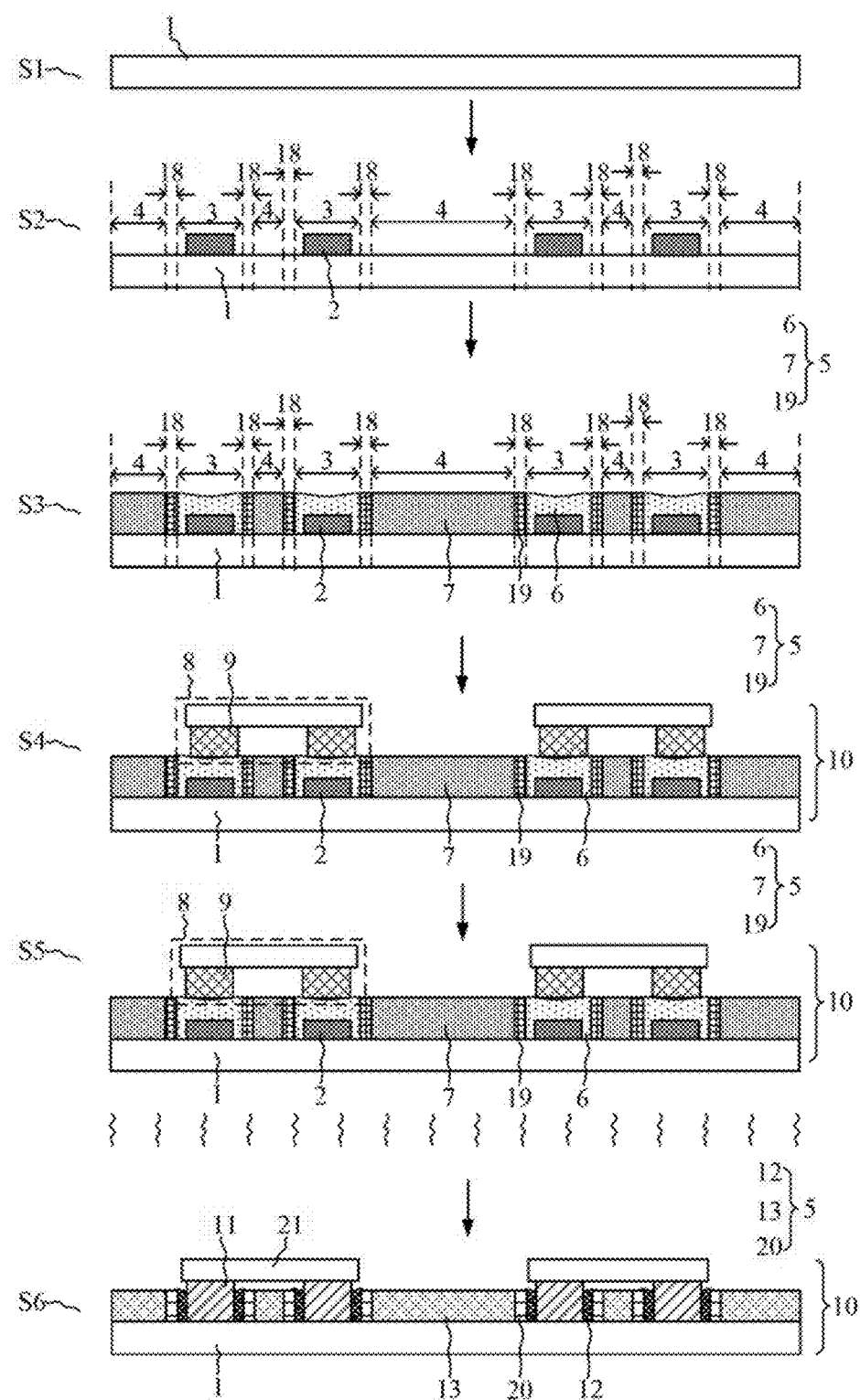
FIG. 20 is another flow diagram showing structures formed in various stages according to the method for manufacturing a display panel provided by some embodiments of the present disclosure.
Figure 21:
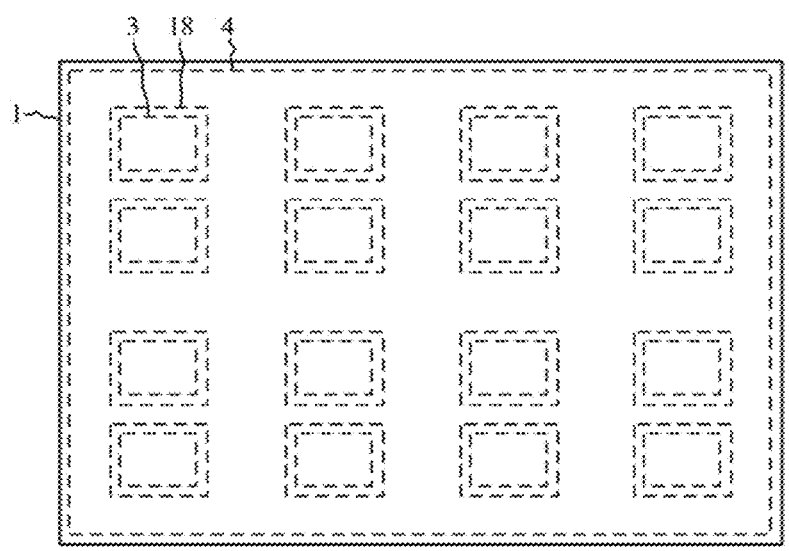
FIG. 21 is a schematic diagram showing an arrangement of a third region provided by some embodiments of the present disclosure.
Figure 22:
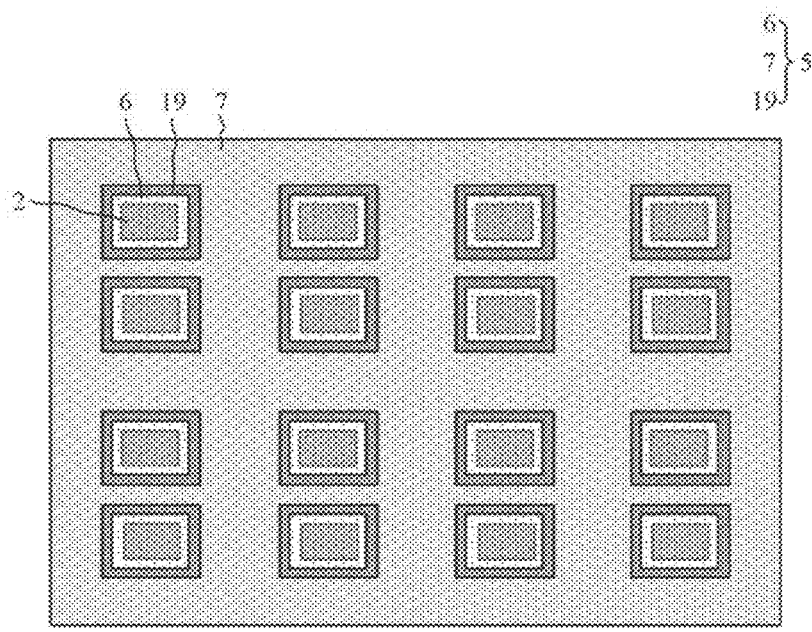
FIG. 22 is another top view of an auxiliary layer before being arranged under a first predetermined condition provided by some embodiments of the present disclosure.

FIG. 20 is another flow diagram showing structures in various stages of the method for manufacturing a display panel provided by some embodiments of the present disclosure. FIG. 21 is a schematic diagram showing an arrangement of a third region 18 provided by some embodiments of the present disclosure. FIG. 22 is another top view of an auxiliary layer 5 before being arranged under a first predetermined condition provided by some embodiments of the present disclosure. In some embodiments, as shown in FIG. 20 to FIG. 22, the backplate 1 includes multiple third regions 18. The third region 18 surrounds one first region 3, and is located between the first region 3 and the second region 4.

When forming the auxiliary layer 5, the auxiliary layer 5 includes multiple third parts 19, each of which is located in one third region 18. Under the first predetermined condition, the fluidity of the third part 19 is smaller than the fluidity of the first part 6, and is greater than the fluidity of the second part 7.

When the intermediate backplate 10 is arranged under the second predetermined condition, the third part 19 forms a solid third member 20.

When the backplate 10 is arranged under the first predetermined condition, the fluidity of the third part 19 is between the fluidity of the first part 6 and the fluidity of the second part 7. The third part 19 may act as a transitional buffer for the flowing of the first part 6, and weakens the blocking force applied by the second part 7 to the first part 6, thereby weakening the effect of this force on the flowing of the first part 6.

In some embodiments, under the first predetermined condition, the first part 6 is in a liquid state, and the second part 7 is in a solid state. In this case, under the first predetermined condition, the first part 6 has a higher fluidity, and a greater surface tension, and thus can better drive the light-emitting element 8 to realize the self-alignment. Meanwhile, the second part 7 is in a solid state and does not flow, and thus can more effectively blocking the flowing of the first part 6, thereby strengthening the act of the flowing of the first part 6 on the light-emitting element 8.

In some embodiments, as shown in FIG. 18, when forming the auxiliary layer 5, the upper surface of the first part 6 on the side opposite to the backplate 1 and the upper surface of the second part 7 on the side opposite to the backplate 1 are at the same level. With such arrangement, when the light-emitting element 8 is released onto the auxiliary layer 5 in the subsequent process step, the stability of the light-emitting element 8 is improved, and incline is avoided.

In some embodiments, as shown in FIG. 16 and FIG. 19, when forming the auxiliary layer 5, a distance between the backplate 1 and an upper surface of the first part 6 away from the backplate 1 is smaller than a distance between the backplate 1 and an upper surface of the second part 7 away from the backplate 1. With such configuration, the upper surface of the second part 7 is higher than the upper surface of the first part 6. As a result, when the first part 6 flows in the subsequent process step, the overflow risk of the first part 6 can be reduced.

It can be understood that combined with the foregoing contents, in some embodiments, both the first part 6 and the second part 7 are photoresists. When coating the photoresist on the backplate 1, the temperature for coating the first region 3 and the temperature for coating the second region 4 are arranged to be different, such that the upper surface of the second part 7 is higher than the upper surface of the first part 6. In another embodiment, the first part 6 is the first colloid 16, the second part 7 is the second colloid 17, and the first colloid 16 and the second part 17 may be formed by different patterning processes, such that the upper surface of the second part 7 is higher than the upper surface of the first part 6.

Figure 23:
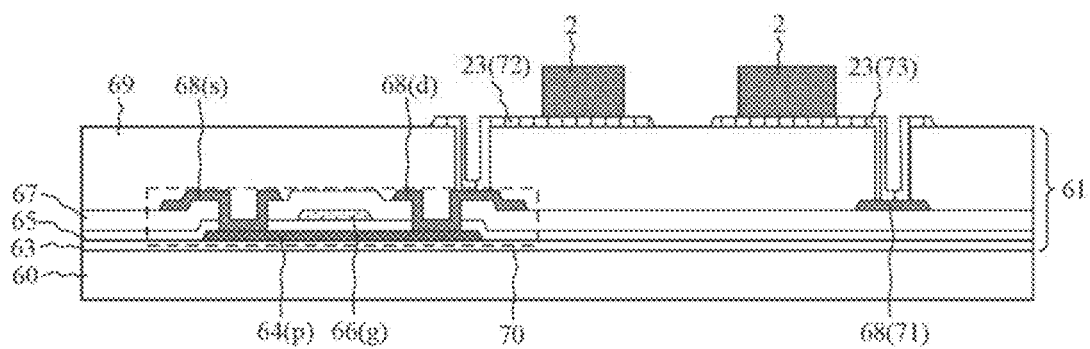
FIG. 23 is a schematic diagram of a backplate provided by some embodiments of the present disclosure.
Figure 24:
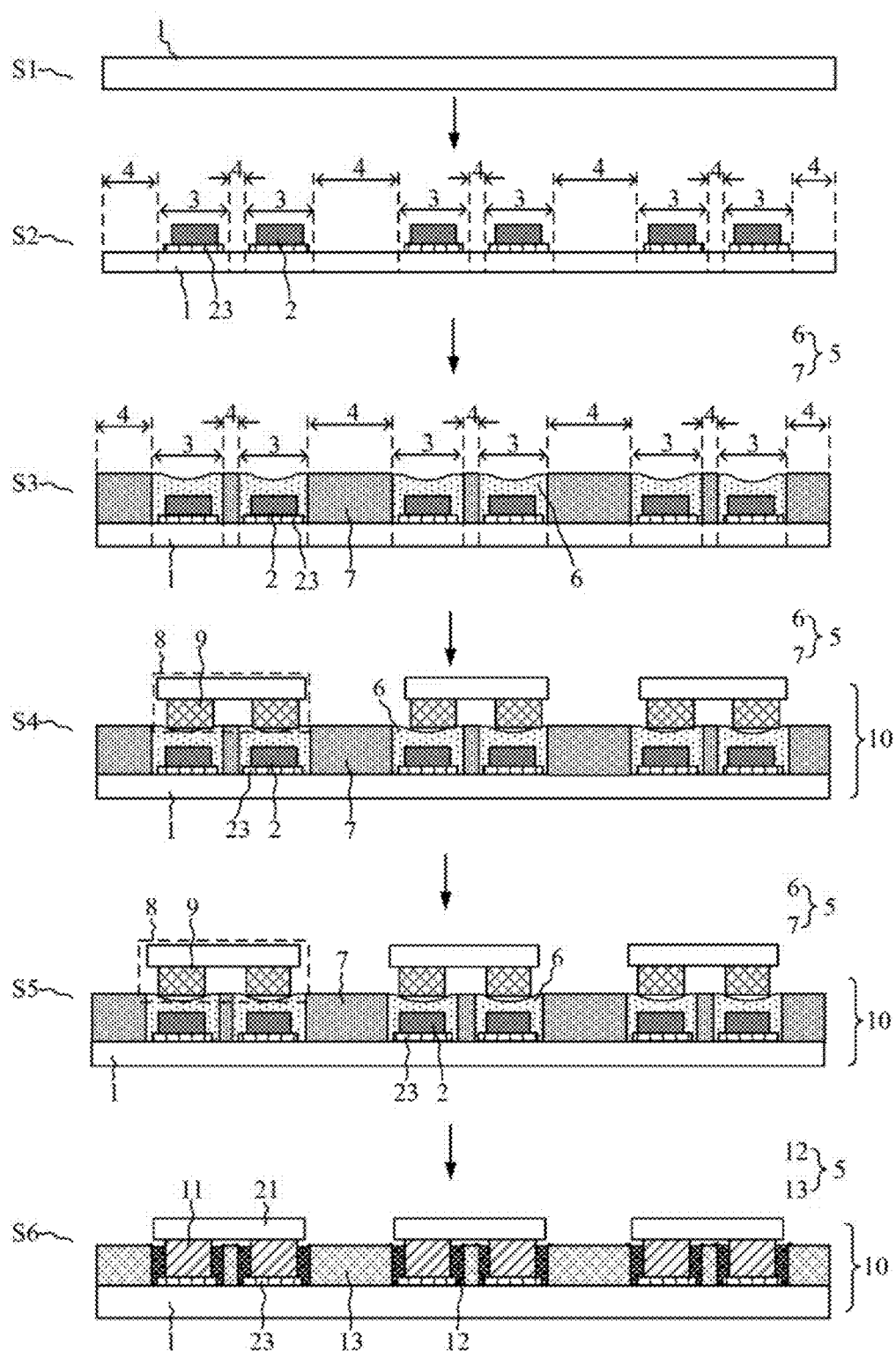
FIG. 24 is another flow diagram showing structures formed in various stages according to the method for manufacturing a display panel provided by some embodiments of the present disclosure.

FIG. 23 is a schematic diagram of a backplate provided by some embodiments of the present disclosure. FIG. 24 is another flow diagram showing structures in various stages of the method for manufacturing a display panel provided by some embodiments of the present disclosure. It can be understood that, as shown in FIG. 23 and FIG. 24, the backplate 1 includes a substrate 60, a circuit layer 61, and a backplate electrode 23. The circuit layer 61 includes: a buffer layer 63, a semiconductor layer 64, a gate insulation layer 65, a first metal layer 66, a first interlayer insulation layer 67, a second metal layer 68, and a flattening layer 69 that are stacked on the substrate 60. The semiconductor layer 64 is used for forming structures such as an active layer p of the transistor 70. The first metal layer 66 is used to form structures such as the gate g of the transistor 70. The second metal layer 68 is used to form structures such as the first electrode s and the second electrode d of the transistor 70, and a negative power supply signal line 71.

The backplate electrode 23 is located at a side of the circuit layer 61 away from the substrate 60. In some embodiments, the backplate electrode 23 includes a first backplate electrode 72 and a second backplate electrode 73. The first backplate electrode 72 is electrically connected to the second electrode d of the transistor 70, and is configured to receive a driving voltage transmitted by the transistor 70. The second backplate electrode 73 is electrically connected to the negative power supply signal line 71, and is configured to receive a negative power supply voltage transmitted by the negative power supply signal line 71.

When forming the bonding part 2, the bonding part 2 is located at a side of the backplate electrode 23 and is in contact with the backplate electrode 23. The first region 3 may cover the backplate electrode 23, such that the subsequently formed first part 6 has a large volume, thereby increasing the act of the flowing of the first part 6 to the light-emitting element 8.

Figure 25:
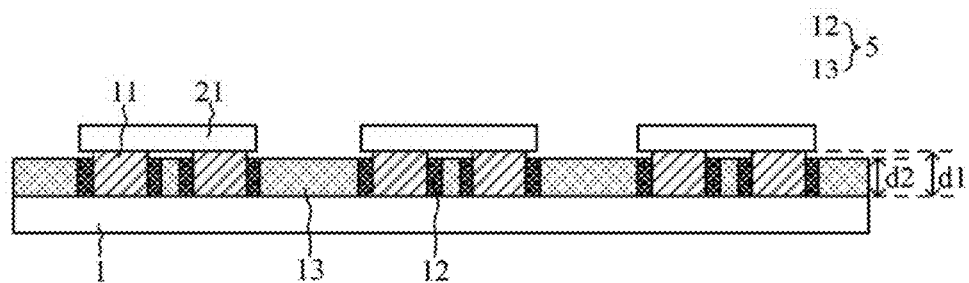
FIG. 25 is a schematic diagram of a display panel provided by some embodiments of the present disclosure.

Some embodiments of the present disclosure provide a display panel. The display panel may be manufactured through the above method. FIG. 25 is a schematic diagram of a display panel provided by some embodiments of the present disclosure. As shown in FIG. 2 and FIG. 25, the display panel includes a backplate 1, an eutectic bonding layer 11 and an auxiliary layer 5 that are located at a side of the backplate 1, and a light-emitting element body 21 located at a side of the eutectic bonding layer 11.

The auxiliary layer 5 includes a first member 12 and a second member 13. At least part of the first member 12 surrounds the eutectic bonding layer 11, and the second member 13 surrounds the first member 12. The light-emitting element body 21 is connected to the eutectic bonding layer 11. The light-emitting element body 21 includes an epitaxial layer, a hole injection layer, an electron injection layer, a hole transport layer, an electron transport layer, a light-emitting layer, and the like.

Combined with the above description of the method for manufacturing the display panel, in the process of manufacturing the display panel, when forming the auxiliary layer 5, the first part 6 is formed in the first region 3, and then the first member 12 is formed through the first part 6; and the second part 6 is formed in the second region 4, and then the second member 13 is formed through the second part 7. Since the fluidity of the material of the first member 12 is high under the first predetermined condition, when the first member 12 flows, the surface tension of the material of the first member 12 causes a slight translation of the light-emitting element 8. In this way, the light-emitting element 8 is pulled to the preset area, and thus the self-alignment of the light-emitting element 8 is realized, thereby improving the transfer accuracy.

Figure 26:
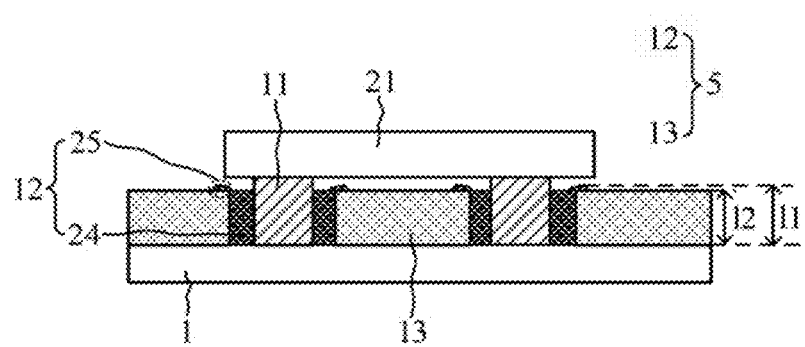
FIG. 26 is another schematic diagram of a display panel provided by some embodiments of the present disclosure.
Figure 27:
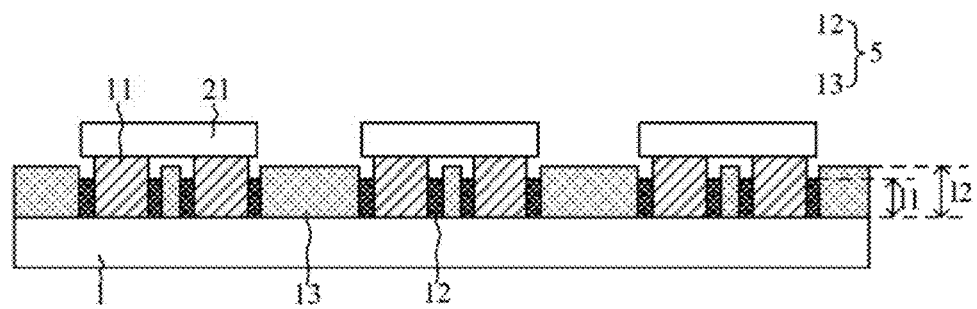
FIG. 27 is yet another schematic diagram of a display panel provided by some embodiments of the present disclosure.

In some embodiments, as shown in FIG. 26 and FIG. 27, a maximum distance between the backplate 1 and the upper surface of the first member 12 away from the backplate 1 is l1, a maximum distance between the backplate 1 and the upper surface of the second member 13 away from the backplate 1 is l2, and l1≠l2. Since the first part 6 flows during the manufacturing process of the display panel, the morphology of the first part 6 changes. As a result, when the first part 6 is cured to form the first member 12 in the subsequent step, the upper surface of the first member 12 and the upper surface of the second member 13 are not at the same level.

FIG. 26 is another schematic diagram of a display panel provided by some embodiments of the present disclosure. In some embodiments, as shown in FIG. 26, the first member 12 includes a surrounding portion 24 and an overflow portion 25. The surrounding portion 24 surrounds the eutectic bonding layer 11, the second member 13 surrounds the surrounding portion 24, the overflow portion 25 and the surrounding portion 24 are communicated with each other, and the overflow portion 25 is located at a side of the second member 13 away from the backplate 1. In this case, l1>l2.

Combined with the above description, both the first member 12 and the second member 13 may be made of photoresist. In this case, the material of the first member 12 and the material of the second member 13 are simultaneously coated on the backplate 1. By smoothing the surface of the coated photoresist, the upper surface of the first part 6 and the upper surface of the second part 7 have a small fluctuation. In this case, when the first part 6 is finally cured to form the first member 12, part of material may overflow and form the overflow portion 25. In this structure, the initially formed first part 6 have a large height, and the first part 6 can provide a greater force on the light-emitting element 8 when flowing, thereby increasing the intensity of action and improving the self-alignment of the light-emitting element 8.

FIG. 27 is yet another schematic diagram of a display panel provided by some embodiments of the present disclosure. In some embodiments, as shown in FIG. 27, the first member 12 surrounds the eutectic bonding layer 11, the second member 13 surrounds the first member 12, and l1<l2.

Combined with the above description, in some embodiments, both the first member 12 and the second member 13 are made of photoresist. When coating the photoresist on the backplate 1, the temperature for coating the first region 3 is different from the temperature for coating the second region 4, such that the upper surface of the second member 13 is higher than the upper surface of the first member 12. In some embodiments, the material of the first member 12 is the first colloid 16, the material of the second member 13 is the second colloid 17, and the first colloid 16 and the second colloid 17 are formed by different patterning processes, such that the upper surface of the second member 13 is higher than the upper surface of the first member 12. In this structure, the height of the initially formed first part 6 is small, and overflow is avoided when flowing or being cured.

Figure 28:
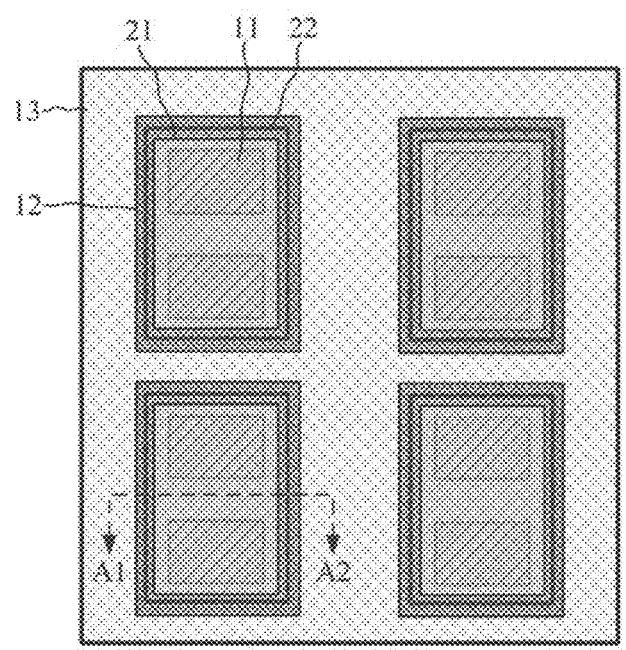
FIG. 28 is a partial top view of a display panel provided by some embodiments of the present disclosure.
Figure 29:
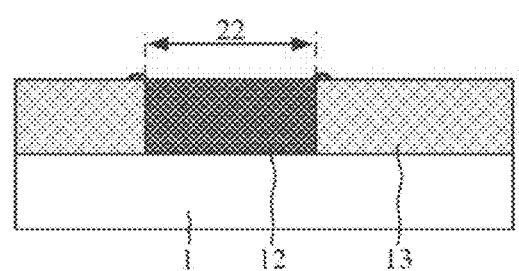
FIG. 29 is a cross-sectional view along line A1-A2 provided by some embodiments of the present disclosure.

FIG. 28 is a partial top view of a display panel provided by some embodiments of the present disclosure. FIG. 29 is a cross-sectional view along line A1-A2 provided by some embodiments of the present disclosure. In some embodiments, as shown in FIG. 28 and FIG. 29, the second member 13 includes multiple hollows 22, and the hollows 22 correspond to the light-emitting element bodies 21 in one-to-one correspondence. At least a part of the first member 12 is located in the hollow 22, and the eutectic bonding layer 11 connected to the light-emitting element body 21 is located in the hollow 22 corresponding to the light-emitting element body 21.

In this structure, one first member 12 corresponds to one light-emitting element 8, the hollow 22 of the second member 13 has a large area, and the first member 12 may surrounds two eutectic bonding layers 11 corresponding to the light-emitting element 8 at the same time. In the manufacturing process of the display panel, as shown in FIG. 7, when the temporary backplate 10 is arranged under the first predetermined condition, the flowing of one first part 6 only acts on the electrode 9 of one light-emitting element 8. The surface tension of the first part 6 when flowing will be more conducive to pulling the corresponding light-emitting element 8 into the light-emitting element pre-arranging region 14, such that the final position of the light-emitting element 8 coincides with the light-emitting element pre-arranging region 14, and the transfer accuracy of the light-emitting element 8 is improved.

Figure 30:
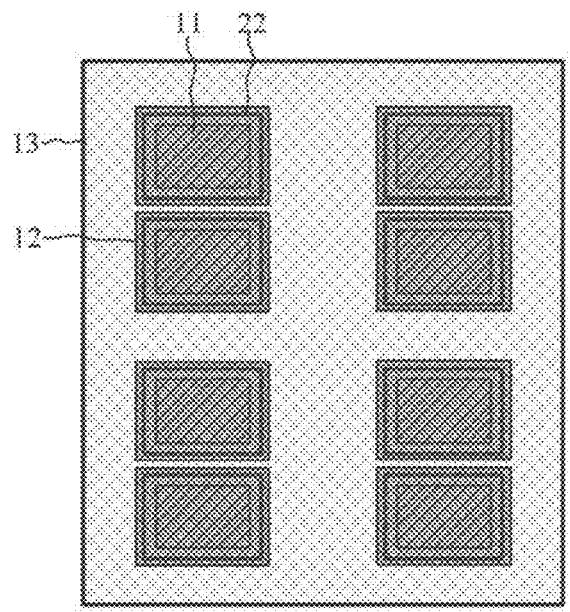
FIG. 30 is another partial top view of a display panel provided by some embodiments of the present disclosure.

FIG. 30 is another partial top view of a display panel provided by some embodiments of the present disclosure. In some embodiments, as shown in FIG. 30, the second member 13 includes multiple hollows 22, and the hollows 22 correspond to multiple parts of eutectic bonding layers 11 in one-to-one correspondence. At least a part of the first member 12 is located in the hollow 22, and one of part of the eutectic bonding layer 11 is located in the hollow 22 corresponding to this part pf the eutectic bonding layer 11.

In this structure, one first member 12 corresponds to one part of the eutectic bonding layer 11, and the hollow 22 of the second member 13 has a small surrounding area. in the manufacturing process of the display panel, as shown in FIG. 2, when the temporary backplate 10 is arranged under the first predetermined condition, the flowing of one first part 6 only acts on one cathode or one anode of the light-emitting element 8. The surface tension of the first part 6 when flowing will be more conducive to making the corresponding one cathode or one anode be aligned with the boding part 2, such that the final position of the light-emitting element 8 coincides with the light-emitting element pre-arranging region 14. Moreover, the second part 7 can limit the movement of the positive and cathodes of the light-emitting element 8. In this way, it is avoided that the anode of the light-emitting element 8 moves to the bonding part 2 that is designed to be in contact with the cathode, and is avoided that the cathode moves to the bonding part 2 that is designed to be in contact with the anode, thereby effectively reducing the short circuit risk of the positive and cathodes of the light-emitting element 8.

In some embodiments, as shown in FIG. 28 to FIG. 34, the second member 34 has multiple hollows 22, and at least a part of the first member 12 is located in the hollow 22.

Figure 31:
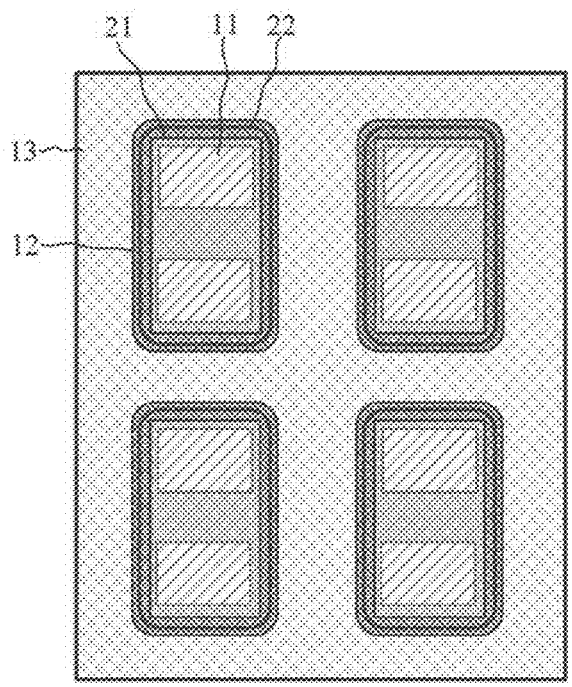
FIG. 31 is another partial top view of a display panel provided by some embodiments of the present disclosure.
Figure 32:
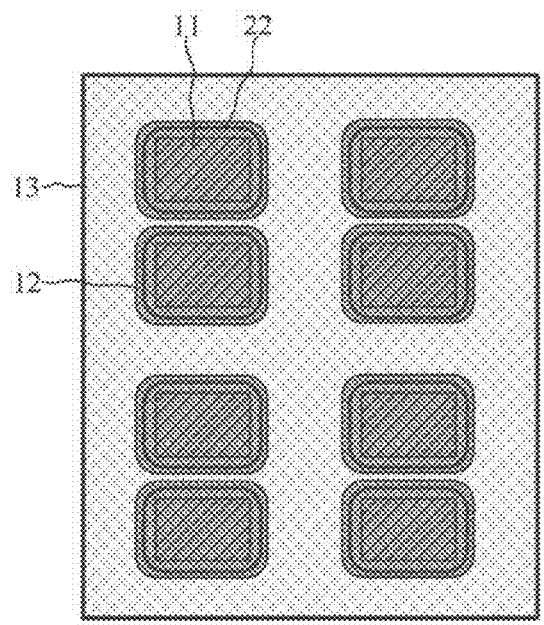
FIG. 32 is another partial top view of a display panel provided by some embodiments of the present disclosure.
Figure 33:
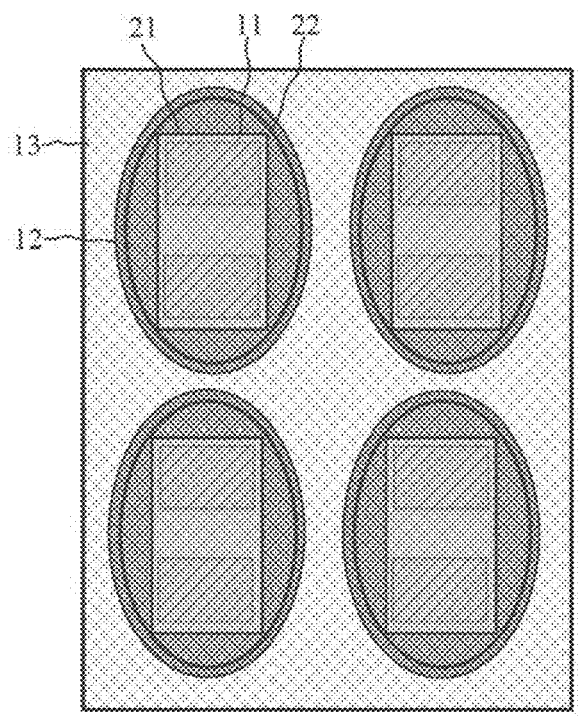
FIG. 33 is another partial top view of a display panel provided by some embodiments of the present disclosure.
Figure 34:
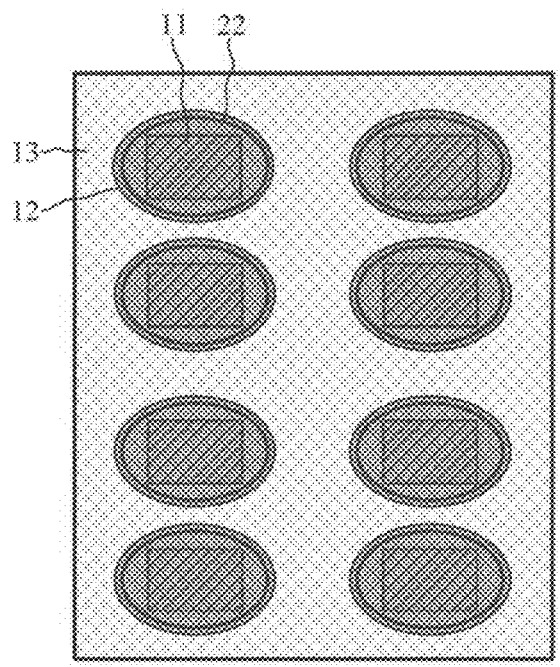
FIG. 34 is another partial top view of a display panel provided by some embodiments of the present disclosure.

Referring to FIG. 28 and FIG. 30 again, the shape of the hollow 22 may be rectangle. FIG. 31 is another partial top view of a display panel provided by some embodiments of the present disclosure. FIG. 32 is another partial top view of a display panel provided by some embodiments of the present disclosure. In another embodiment, as shown in FIG. 31 and FIG. 32, the shape of the hollow 22 may be a rounded rectangle. FIG. 33 is another partial top view of a display panel provided by some embodiments of the present disclosure. FIG. 34 is another partial top view of a display panel provided by some embodiments of the present disclosure. In yet another embodiment, as shown in FIG. 33 and FIG. 34, the shape of the hollow 22 may be round or oval.

In the above structures, the hollow 22 of the second member 13 has a regular shape, and it indicates that the structure in the first part 6 is also regular when forming the auxiliary layer 5. As a result, when the first part 6 flows, the surface tension of the first part 6 has a substantially uniform effect on the light-emitting element 8 in all directions, so it is more conducive to the self-alignment of the light-emitting element 8.

In some embodiments, as shown in FIG. 25, a thickness d1 of the eutectic bonding layer 11 in a direction perpendicular to the plane of the backplate 1 is greater than a thickness d2 of the second member 13 in the direction perpendicular to the plane of the backplate 1.

It can be understood that, as shown in FIG. 2, after the thermal compression bonding process, the electrode 9 of the light-emitting element 8 and the bonding part 2 form the eutectic bonding layer 11, and the thickness of the eutectic bonding layer 11 is smaller than a sum of the thickness of the electrode 9 of the light-emitting element 8 and the thickness of the bonding part 2 before the thermal compression bonding process. For example, the thickness of the electrode 9 of the light-emitting element 8 is 2 μm, the thickness of the bonding part 2 is 3 μm, and the thickness of the eutectic bonding layer 11 after the bonding process is 4 μm. It can be understood that the greater the thickness of the eutectic bonding layer 11, the greater the sum of the thickness of the electrode 9 of the light-emitting element 8 and the thickness of the bonding part 2 before the thermal compression bonding. That is, if the thickness of the eutectic bonding layer 11 is greater than the thickness of the second member 13, the sum of the thickness of the electrode 9 of the light-emitting element 8 and the thickness of the bonding part 2 before the thermal compression bonding is greater than the thickness of the second member 13.

Based on the above structure, in the process of manufacturing the display panel, when the intermediate backplate 10 is arranged under the first predetermined condition, the material of the first part 6 has a high fluidity, and may overflows to the upper surface of the second part 7. By setting the total thickness of the bonding part 2 and the electrode 9 electrically connected to the bonding part 2 greater, there is a space between the upper surface of the second member 13 and the light-emitting element body 21 when the first part 6 and the second part 7 are cured to form the first member 12 and the second member 13. This space can receive the overflow part of the first member 12. In this way, it is avoided that this overflow part of the first member 12 jacks up the light-emitting element body 21, and thus it is avoided that the jacking up affects the stability of the light-emitting element body 21.

Figure 35:
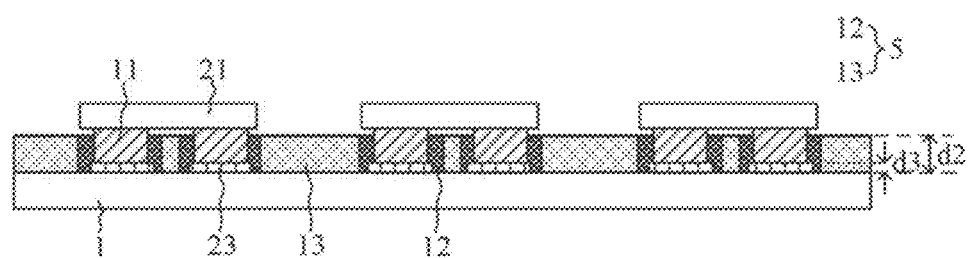
FIG. 35 is another schematic diagram of a display panel provided by some embodiments of the present disclosure.

FIG. 35 is another schematic diagram of a display panel provided by some embodiments of the present disclosure. In some embodiments, as shown in FIG. 35, the backplate 1 includes a backplate electrode 23. The eutectic bonding layer 11 is located between the backplate electrode 23 and the light-emitting element body 21. The backplate 1 is in contact with the eutectic bonding layer 11. A thickness d2 of the second member 13 in the direction perpendicular to the plane of the backplate 1 is greater than a thickness d3 of the backplate 23 in the direction perpendicular to the plane of the backplate 1.

Based on the above structure, as shown in FIG. 24, when forming the auxiliary layer 5, the second part 7 is higher than the backplate electrode 23, and the second part 7 can block the electrode of the light-emitting element 8. In this way, when the display panel is subjected to an external force, the risk of inclining of the light-emitting element 8 can be reduced. Under the first predetermined condition, the second part 7 can also block the flowing of the first part 6, thereby enhancing the effect of the flowing of the first part 6 on the light-emitting element 8.

In some embodiments, under the first predetermined condition, the fluidity of the material of the first member 12 is greater than the fluidity of the material of the second member 13.

Combined with the description of the manufacturing method of the display panel, when the intermediate backplate 10 is arranged under the first predetermined condition, the first part 6 has a high fluidity, the surface tension of the first part 6 causes a slight translation of the light-emitting element 8. In this way, the light-emitting element 8 is pulled to the preset area, and thus the self-alignment of the light-emitting element 8 is realized, thereby improving the transfer accuracy.

In some embodiments, the first predetermined condition includes: heating to the first predetermined temperature range. Under the first predetermined condition, the viscosity of the material of the first member 12 is smaller than the viscosity of the material of the second member 13.

The viscosity characterizes the fluidity of the material. The smaller the viscosity, the higher the fluidity. In the first predetermined temperature range, the viscosity of the material of the first member 12 is small, indicating that it has high fluidity, which can meet the fluidity requirement.

In some embodiments, within the first predetermined temperature range, if the temperature rises by $\Delta T$, the viscosity of the material of the first member 12 deceases by $\Delta \eta 1$, the viscosity of the material of the second member 13 deceases by $\Delta \eta 2$, and $\Delta \eta 1 > \Delta \eta 2$.

When the temperature rises by $\Delta T$, the decreasing amount of the viscosity of the material of the first member 12 is greater than the decreasing amount of the viscosity of the material of the second member 13, such that the viscosity of the material of the first member 12 is smaller than that of the material of the second member 13. That is, the material of the first member 12 has a higher fluidity. In this way, in the process of manufacturing the display panel, the self-alignment of the light-emitting element 8 can be better achieved by utilizing the fluidity of the material of the first part 6.

In some embodiments, within the first predetermined temperature range, as the temperature increases, the acceleration of the decreasing rate of the viscosity of the material of the first member 12 is greater than 0.

That is, as the temperature rises, the decreasing rate of the viscosity of the material of the first member 12 increases. As a result, the fluidity requirements of the first part 6 can be met at a slightly lower temperature, reducing the requirement for the first predetermined temperature range.

In some embodiments, within the first predetermined temperature range, as the temperature rises, the acceleration of the decreasing rate of the viscosity of the material of the second member 13 is greater than 0, and the acceleration of the decreasing rate of the viscosity of the material of the second member 13 is smaller than the acceleration of the decreasing rate of the viscosity of the material of the first member 12. In some embodiments, the acceleration of the decreasing rate of the viscosity of the material of the second member 13 is 0. In some embodiments, the acceleration of the decreasing rate of the viscosity of the material of the second member 13 is smaller than 0.

When the material of the second member 13 has the above characteristics, as the temperature rises, with satisfying the fluidity requirement of the material of the first member 12, the material of the second member 13 may have lower fluidity. As a result, in the manufacturing process of the display panel, the second part 7 can better block the flowing of the first part 6, strengthening the effect of the flowing of the first part 6 on the light-emitting element 8.

In some embodiments, the first predetermined condition includes applying an external force. When the external force is applied, the thixotropy of the material of the first member 12 is greater than the thixotropy of the material of the second member 13.

Thixotropy characterizes the ability of the fluid to restore its original structure after the structure is changed under the action of shear force. When the material is subjected to external force, the greater the thixotropy, the greater the affecting degree of the fluidity of the material by the external force. When an external force is applied, the thixotropy of the material of the first member 12 is large, indicating that it has high fluidity, and thus the material of the first member 12 can meet the fluidity requirement.

In some embodiments, the first member 12 includes: acrylic adhesive, non conductive paste (NCP), non conductive film (NCF) or unexposed photoresist, and the second member 13 includes exposed photoresist.

In some embodiments, the first member 12 includes unexposed photoresist, and the second member 13 includes exposed photoresist. That is, the first member 12 and the second member 13 are made of the same material. In another embodiment, the first member 12 includes acrylic adhesive, NCP, or NCF; and the second member 13 includes exposed photoresist. That is, the first member 12 and the second member 13 are made of different materials.

When the first member 12 and/or the second member 13 includes the photoresist, the photoresist has a viscosity. When the photoresist is not exposed, the photoresist does not harden since no crosslinking reaction occurs. Within a certain temperature range, the viscosity of the photoresist decreases as the temperature increases, and accordingly the heated photoresist has a higher viscosity. After being exposed, the photoresist hardens due to the crosslinking reaction, and is kept in a cured state after being heated, such that the photoresist has a very low fluidity. The acrylic adhesive, NCP, and NCF all have a certain viscoelasticity. When the first member 12 includes acrylic adhesive, NCP, or NCF, after the first member 12 is heated, the viscosity of the first member 12 decreases, the fluidity of the first member 12 increases, and thus the fluidity requirement for the first member 12 can also be satisfied.

Figure 36:
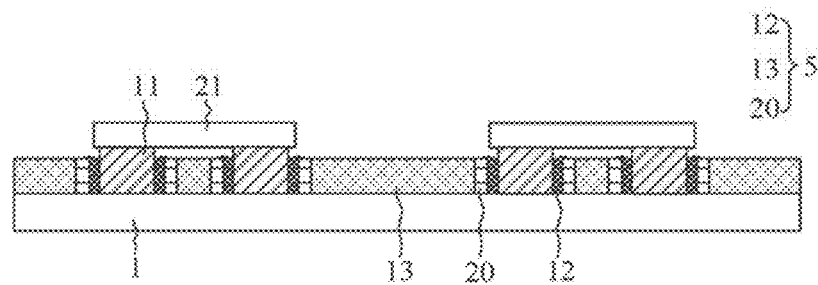
FIG. 36 is another schematic diagram of a display panel provided by some embodiments of the present disclosure.

FIG. 36 is another schematic diagram of a display panel provided by some embodiments of the present disclosure. In some embodiments, as shown in FIG. 36, the auxiliary layer 5 includes multiple third members 20. Each third member 20 surrounds one first member 12, and is located between the first member 12 and the second member 13. Under the first predetermined condition, the fluidity of the material of the third member 20 is smaller than the fluidity of the material of the first member 12, and is greater than the fluidity of the material of the second member 13.

Correspondingly, as shown in FIG. 20, in the manufacturing process of the display panel, it needs to define third regions 18 for surrounding the first regions 3 respectively. When forming the auxiliary layer 5, the auxiliary layer 5 includes third parts 19 located in the third regions 18 respectively. When the intermediate backplate 10 is arranged under the first predetermined condition, the fluidity of the material of the third part 19 is between the fluidity of the first part 6 and the fluidity of the second part 7. The third part 19 may act as a transitional buffer for the flowing of the first part 6, weakens the blocking force applied by the second part 7 to the first part 6, thereby weakening the effect of this force on the flowing of the first part 6.

Figure 37:
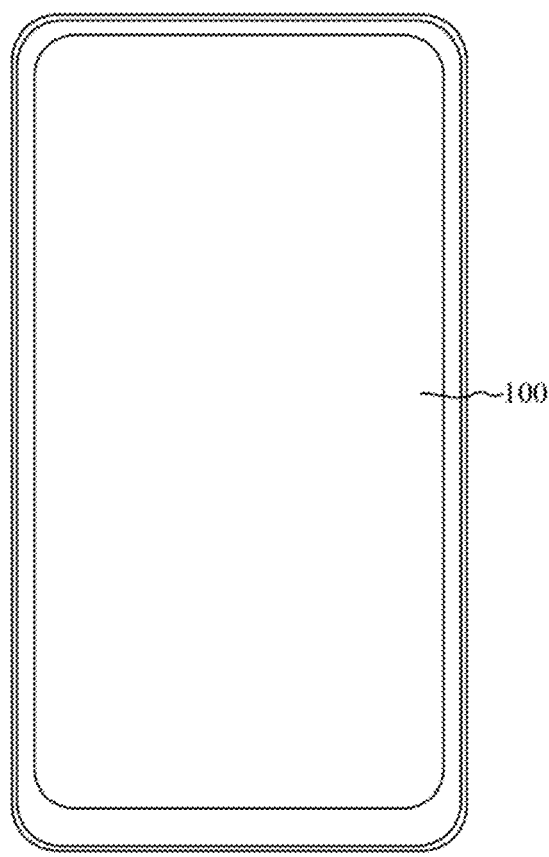
FIG. 37 is a schematic diagram of a display apparatus provided by some embodiments of the present disclosure.

Some embodiments of the present disclosure provide a display apparatus, and FIG. 37 is a schematic diagram of a display apparatus provided by some embodiments of the present disclosure. As shown in FIG. 37, the display apparatus includes a display panel 100 provided by any embodiment of the present disclosure. The structure of the display panel 100 has been described in the above embodiments and will not be repeated herein. The display apparatus provided by some embodiments of the present disclosure can be any electronic device with a display function, such as a mobile phone, a tablet computer, a notebook computer, an e-book, or a television.

The above are merely exemplary embodiments of the present disclosure and are not intended to limit the present disclosure. Any modifications, equivalents, improvements, etc., which are made within the principles of the present disclosure, should fall into the scope of the present disclosure.

Finally, it can be understood that the above embodiments are only used to illustrate, rather to limit, the technical solution of the present disclosure. Although the present disclosure is described in details with reference to the above embodiments, it should be understood by those skilled in the art that they can still modify the technical solution recorded in the above embodiments, or to make equivalent replacement to some or all of the technical features thereof; and these modifications or replacements do not make the essence of the corresponding technical solution deviate from the scope of the technical solutions of all embodiments of the present disclosure.

What is claimed is:

1. A method for manufacturing a display panel, comprising:
   providing a backplate;
   forming a plurality of bonding parts on the backplate, the backplate comprising a plurality of first regions and a second region surrounding the plurality of first regions, and the plurality of bonding parts being located in the plurality of first regions;
   forming an auxiliary layer on the backplate, the auxiliary layer covering the backplate and the plurality of bonding parts, and the auxiliary layer comprising a plurality of first parts located in the plurality of first regions and a second part located in the second region;
   releasing a plurality of light-emitting elements onto the auxiliary layer in such a manner that electrodes of the plurality of light-emitting elements are in contact with the plurality of first parts to form an intermediate backplate;
   arranging the intermediate backplate under a first predetermined condition, wherein under the first predetermined condition, the plurality of first parts is in a liquid state, and the second part is in a solid state;
   bonding the electrodes of the plurality of light-emitting elements and the plurality of bonding parts to form a eutectic bonding layer; and
   arranging the intermediate backplate under a second predetermined condition in such a manner that the plurality of first parts forms a plurality of solid-state first members and the second part forms a solid-state second member.

2. The method according to claim 1, wherein the backplate comprises a plurality of light-emitting element pre-arranging regions, one of the plurality of light-emitting elements is provided in one of the plurality of light-emitting element pre-arranging regions, and wherein the plurality of first regions corresponds to the plurality of light-emitting element pre-arranging regions in one-to-one correspondence; or
   wherein the plurality of first regions corresponds to the plurality of bonding parts in one-to-one correspondence.

3. The method according to claim 1, wherein the plurality of first regions covers the plurality of bonding parts, and a distance d between an edge of one first region of the plurality of first regions and an edge of one bonding part of the plurality of bonding parts corresponding to the one first region satisfy: 3 μm≤d<30 μm.

4. The method according to claim 1, wherein one of the plurality of first regions has a rectangle shape, a rounded rectangle shape, a circle shape, or an oval shape.

5. The method according to claim 1, wherein said forming the auxiliary layer comprises:
   coating a photoresist on the backplate, the photoresist covering the backplate and the plurality of bonding parts; and
   not exposing photoresist in the plurality of first regions, and forming the plurality of first parts by utilizing the unexposed photoresist; and exposing photoresist in the second region, and forming the second part by utilizing the exposed photoresist;
   wherein said arranging the intermediate backplate under the first predetermined condition comprises:
   heating the intermediate backplate to a first predetermined temperature range, wherein within the first predetermined temperature range, a viscosity of the unexposed photoresist is smaller than a viscosity of the exposed photoresist; and the first predetermined temperature range has a minimum temperature value of 80° C. and a maximum temperature value of 120° C.; and
   wherein said arranging the intermediate backplate under the second predetermined condition comprises:

heating the intermediate backplate to a second predetermined temperature range, wherein within the second predetermined temperature range, the unexposed photoresist is in a solid state to form the plurality of first members, and the exposed photoresist is in a solid state to form the second member; and the second predetermined temperature range has a minimum temperature value of 150° C.

6. The method according to claim 1, wherein said forming the auxiliary layer comprises:
   forming a plurality of first colloids in the plurality of first regions, and forming the plurality of first parts by utilizing the plurality of first colloids; and forming a second colloid in the second region, and forming the second part by utilizing the second colloid;
   wherein said arranging the intermediate backplate under the first predetermined condition comprises:
   applying an external force to the intermediate backplate, wherein when applying the external force to the intermediate backplate, a thixotropy of the plurality of first colloids is greater than a thixotropy of the second colloid; and
   wherein said arranging the intermediate backplate under the second predetermined condition comprises:
   stopping applying the external force to the intermediate backplate and letting the intermediate backplate to stand in such a manner that the plurality of first colloids is a solid state to form the plurality of first members and the second colloid is a solid state to form the second member.

7. The method according to claim 1, wherein when forming the auxiliary layer, an upper surface of one first part of the plurality of first parts away from the backplate is aligned with an upper surface of the second part away from the backplate; or
   wherein when forming the auxiliary layer, a distance between the backplate and an upper surface of one first part of the plurality of first parts away from the backplate is smaller than a distance between the backplate and an upper surface of the second part away from the backplate.

8. A display panel, comprising:
   a backplate;
   a eutectic bonding layer and an auxiliary layer that are located at a side of the backplate, the auxiliary layer comprising a plurality of first members and a second member, at least one first member of the plurality of first members surrounding one part of the eutectic bonding layer, and the second member surrounding the plurality of first members; and
   a plurality of light-emitting element bodies, each of the plurality of light-emitting element bodies being located at a side of the eutectic bonding layer, and being connected to one part of the eutectic bonding layer, wherein a thickness of the eutectic bonding layer in a direction perpendicular to a plane of the backplate is greater than a maximum thickness of each of the plurality of first members in the direction perpendicular to the plane of the backplate, and the thickness of the eutectic bonding layer is also greater than a maximum thickness of the second member in the direction perpendicular to the plane of the backplate.

9. The display panel according to claim 8, wherein a maximum distance l1 between the backplate and an upper surface of one first member of the plurality of first members away from the backplate and a maximum distance l2 between the backplate and an upper surface of the second member away from the backplate satisfy l1≠l2.

10. The display panel according to claim 9, wherein one of the plurality of first members comprises a surrounding portion and an overflow portion, wherein the surrounding portion surrounds a part of the eutectic bonding layer, the second member surrounds the surrounding portion, the overflow portion and the surrounding portion are communicated with each other, and the overflow portion is located at a side of the second member away from the backplate.

11. The display panel according to claim 9, wherein one first member of the plurality of first members surrounds one part of the eutectic bonding layer, the second member surrounds the first member, and l1<l2; or
   wherein the second member comprises a plurality of hollows corresponding the plurality of light-emitting element bodies in one-to-one correspondence; and
   wherein at least a part of one first member of the plurality of first members is located in one of the plurality of hollows, and at least one part of the eutectic bonding layer connected to one light-emitting element body of the plurality of light-emitting element bodies is located in one hollow of the plurality of hollows corresponding to the one light-emitting element body.

12. The display panel according to claim 8, wherein the second member comprises a plurality of hollows, and the plurality of hollows corresponds to a plurality of parts of the eutectic bonding layer in one-to-one correspondence; and
   wherein at least a part of one first member of the plurality of first members is located in one of the plurality of hollows, and one part of the plurality of parts of the eutectic bonding layer is located in one hollow of the plurality of hollows corresponding to the one part.

13. The display panel according to claim 8, wherein the second member comprises a plurality of hollows, wherein at least a part of one first member of the plurality of first members is located in one of the plurality of hollows, and wherein one of the plurality of hollows has a rectangle shape, a rounded rectangle shape, a circle shape, or an oval shape.

14. The display panel according to claim 8, wherein a thickness of the eutectic bonding layer in the direction perpendicular to the plane of the backplate is greater than a thickness of the second member in the direction perpendicular to the plane of the backplate.

15. The display panel according to claim 8, wherein the backplate comprises a backplate electrode, wherein the eutectic bonding layer is located between the backplate electrode and one of the plurality of light-emitting element bodies, and the backplate electrode is in contact with the eutectic bonding layer; and
   wherein a thickness of the second member in the direction perpendicular to the backplate is greater than a thickness of the backplate electrode in the direction perpendicular to the plane of the backplate.

16. The display panel according to claim 8, wherein under a first predetermined condition, a fluidity of a material of the plurality of first members is greater than a fluidity of a material of the second member.

17. The display panel according to claim 8, wherein one of the plurality of first members is made of an acrylic adhesive, a non conductive paste (NCP), a non conductive film (NCF) or an unexposed photoresist, and the second member is made of an exposed photoresist.

18. The display panel according to claim 8, wherein the auxiliary layer further comprises a plurality of third members, and each of the plurality of third members surrounds one first member of the plurality of first members and is located between the one first member and the second member, and wherein under a first predetermined condition, a fluidity of a material of the plurality of third members is smaller than a fluidity of a material of the plurality of first members, and is greater than a fluidity of a material of the second member.

19. A display apparatus, comprising a display panel, wherein the display panel comprises:

a backplate;

a eutectic bonding layer and an auxiliary layer that are located at a side of the backplate, the auxiliary layer comprising a plurality of first members and a second member, at least one first member of the plurality of first members surrounding one part of the eutectic bonding layer, and the second member surrounding the plurality of first members; and a plurality of light-emitting element bodies, each of the plurality of light-emitting element bodies being located at a side of the eutectic bonding layer, and being connected to one part of the eutectic bonding layer, wherein a thickness of the eutectic bonding layer in a direction perpendicular to a plane of the backplate is greater than a maximum thickness of each of the plurality of first members in the direction perpendicular to the plane of the backplate, and the thickness of the eutectic bonding layer is also greater than a maximum thickness of the second member in the direction perpendicular to the plane of the backplate.

\* \* \* \* \*